(12) United States Patent
Nakajima et al.

(10) Patent No.: US 12,163,247 B2
(45) Date of Patent: *Dec. 10, 2024

(54) METHOD FOR PRODUCING SILICON INGOT SINGLE CRYSTAL

(71) Applicant: GlobalWafers Co., Ltd., Hsinchu (TW)

(72) Inventors: Kazuo Nakajima, Hsinchu (TW); Masami Nakanishi, Hsinchu (TW); Yu Sheng Su, Hsinchu (TW); Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 141 days.

This patent is subject to a terminal disclaimer.

(21) Appl. No.: 17/964,039

(22) Filed: Oct. 12, 2022

(65) Prior Publication Data

US 2023/0160095 A1 May 25, 2023

Related U.S. Application Data

(60) Provisional application No. 63/254,539, filed on Oct. 12, 2021.

(51) Int. Cl.
*C30B 15/10* (2006.01)
*C30B 15/14* (2006.01)
(Continued)

(52) U.S. Cl.
CPC ............ *C30B 15/14* (2013.01); *C30B 15/10* (2013.01); *C30B 15/20* (2013.01); *C30B 29/06* (2013.01); *C30B 35/002* (2013.01)

(58) Field of Classification Search
CPC ......... C30B 15/14; C30B 15/10; C30B 15/20; C30B 29/06; C30B 35/002
See application file for complete search history.

(56) References Cited

U.S. PATENT DOCUMENTS

2021/0363656 A1* 11/2021 Nakajima ............... C30B 29/06

FOREIGN PATENT DOCUMENTS

| JP | 2005200228 | 7/2005 |
| JP | 5398775 | 1/2014 |

(Continued)

OTHER PUBLICATIONS

Kazuo Nakajima et al., "Theoretical distributions of point-defect concentration in a Si ingot grown inside a melt using the noncontact crucible method considering the accumulation effect of diffusion flux", Journal of Crystal Growth, Jul. 18, 2020, pp. 1-9, vol. 547.

(Continued)

*Primary Examiner* — Robert M Kunemund
(74) *Attorney, Agent, or Firm* — JCIPRNET

(57) ABSTRACT

A method for producing Si ingot single crystal including a Si ingot single crystal growing step, a temperature gradient controlling step and a continuous growing step is provided. In the growing step, the Si ingot single crystal is grown in silicon melt in crucible, and the growing step includes providing a low-temperature region in the Si melt and providing a silicon seed to contact the melt surface of the silicon melt to start crystal growth, and silicon single crystal grows along the melt surface of the silicon melt and toward the inside of the silicon melt. In the temperature gradient controlling step, the under-surface temperature gradient of the silicon single crystal is G1, the above-surface temperature gradient of the silicon single crystal is G2, G1 and G2 satisfy: G2/G1<6. The step of controlling the temperature gradient of silicon single crystal is repeated to obtain the Si ingot single crystal.

15 Claims, 12 Drawing Sheets

(51) Int. Cl.
  *C30B 15/20*   (2006.01)
  *C30B 29/06*   (2006.01)
  *C30B 35/00*   (2006.01)

(56) References Cited

FOREIGN PATENT DOCUMENTS

JP    2019218245    12/2019
TW     202144628    12/2021

OTHER PUBLICATIONS

M. Tokairin et al., "Formation mechanism of a faceted interface: In situ observation of the Si(100) crystal-melt Interface during crystal growth", Physical Review B, Nov. 12, 2009, pp. 174108-1-174108-4, vol. 80, No. 174108.
"Office Action of Taiwan Counterpart Application", issued on Sep. 4, 2023, p. 1-p. 7.
"Office Action of Japan Counterpart Application", issued on Jan. 9, 2024, p. 1-p. 2.

\* cited by examiner

METHOD FOR PRODUCING SILICON INGOT SINGLE CRYSTAL

CROSS-REFERENCE TO RELATED APPLICATION

This application claims the priority benefit of U.S. application Ser. No. 63/254,539, filed on Oct. 12, 2021. The entirety of the above-mentioned patent application is hereby incorporated by reference herein and made a part of this specification.

BACKGROUND

Technical Field

The present disclosure relates to a semiconductor manufacturing technology, and more particularly, to a method for manufacturing a silicon ingot single crystal with very few defects.

Description of Related Art

With the development of high technology such as communication, display, solar cells, artificial intelligence (AI), information society will develop more vigorously in the future. For silicon ingot single crystal serving as the main material of semiconductor components supporting the development of these fields, quality requirement is set higher. Therefore, the demand for high-quality silicon ingot single crystal to meet the development of high-tech industries is also increasing.

Currently, such ultra-high-quality silicon ingot single crystals are mainly manufactured by using Czochralski growing method (hereinafter referred to as "CZ growing method"). FIG. 1 is a schematic diagram of a conventional manufacturing device for growing silicon ingot single crystal by using the CZ growing method. Referring to FIG. 1, a manufacturing device 10 for growing silicon ingot single crystal by using the CZ growing method includes a crucible 12, a silicon melt 13 disposed in the crucible 12, and a pulling mechanism 15 for pulling the grown silicon ingot 14. As shown in FIG. 1, the growth interface G1 exists above the melt surface of the silicon melt when crystal growth is performed by using the CZ growing method, and the silicon melt forming the growth interface G1 is mainly composed of thin and small melts that protrude from the surface due to surface tension, as the growth interface G1 protruding upward shown in FIG. 1. Therefore, when crystal growth is performed by using the CZ growing method, the technical problem is that it is difficult to control the temperature distribution in the growth interface G1. More specifically, in the preparation of theoretically defect-free silicon ingot single crystal by using the CZ growing method, the following method is adopted to reduce the concentration of point defects: the temperature gradient near the growth interface is set to be steep, so that the diffusion flux of interstitial silicon atoms increases, thereby annihilating vacancy by pair-annihilation, that is, the concentration of point defects is reduced as much as possible by reducing the concentration of vacancies together with the concentration of interstitial silicon atoms.

However, in the related art using the CZ growing method, the range of ingot crystal of silicon ingot single crystal near the growth interface that may be used for point defect control is extremely narrow. To perform the control, the growth rate v needs to be very precise, and the growth condition of silicon ingot single crystal needs to be controlled through a complex means. Specifically, these control variables at least include temperature distribution homogenization along the growth interface, control of temperature gradients, and pulling rates. Since the related art has not yet provided a complete theoretical solution to the complex control, and most of the related art is carried out in a try and error manner, there is a lack of versatility and reproduction in the defect-free technology of the CZ growing method in related art.

In recent years, in order to solve the problem of the CZ growing method, Patent Document 1 (Japanese Laid-Open No. 5398775) provides another silicon ingot single crystal growing method, which is an NOC method (Noncontact Crucible Method) that is able to grow silicon ingot single crystal inside the silicon melt without contacting the crucible wall. As shown in FIG. 2, the manufacturing method includes a crucible 22, a silicon melt 23 disposed in the crucible 22, and a pulling mechanism 25 for pulling the grown silicon ingot 24. As shown in FIG. 2, in the NOC method, an insulating material 26 is provided at the bottom of the crucible 22 to form a low-temperature region 23R in the silicon melt 23. In addition, a silicon ingot single crystal 24 is grown in the silicon melt 23.

However, in the related art, there is a lack of a complete theoretical solution for how to effectively grow defect-free and ultra-high-quality silicon ingot single crystal by using the NOC method.

The inventor(s) of the present disclosure has carried out research thoroughly based on Patent Document 2 (Taiwan Patent Publication No. TW202144628A) along with application of scientific principles, and provides a simulation model to calculate the distribution of point defects in silicon ingot single crystal grown by using the NOC method, whereby the growth environment and conditions of silicon ingot single crystal may be controlled more accurately.

In the simulation model established in Patent Document 2 (Taiwan Patent Publication No. TW202144628A), it is initially suggested that different temperature distributions and different temperature gradients may cause point defects with different distributions in the grown silicon ingot single crystal. However, there is a lack of research on how to specifically set the temperature gradient in the field to manufacture silicon ingot single crystal more accurately in the related art.

SUMMARY

The manufacturing method of silicon ingot single crystal of the present disclosure is performed based on the simulation relationship between the lattice vacancy and the interstitial flux in the constructed NOC crystal, and through the two-stage control of the temperature gradient above the melt surface of the silicon melt and the temperature gradient below the melt surface of the silicon melt in the growth of silicon ingot single crystal, it is possible to realize effective growth of ultra-high-quality silicon ingot single crystal with very few defects (or defect-free).

The disclosure provides a method for manufacturing silicon ingot single crystal, which manufactures silicon ingot single crystal by using the noncontact crucible method. The method includes a silicon ingot single crystal growing step, a controlling step for controlling temperature gradient of silicon single crystal and a continuous growing step. In the silicon ingot single crystal growing step, the silicon ingot single crystal is grown in silicon melt in crucible, and the silicon ingot single crystal growing step includes providing a low-temperature region in the silicon melt and providing a silicon seed to contact the melt surface of the silicon melt to start crystal growth, and silicon single crystal grows along the melt surface of the silicon melt and toward the inside of the silicon melt. In the controlling step for controlling the temperature gradient of silicon single crystal, the under-surface temperature gradient of the silicon single crystal under a melt surface of the silicon melt is G1, the above-surface temperature gradient of the silicon single crystal above the melt surface of the silicon melt is G2, and the under-surface temperature gradient G1 of the silicon single crystal and the above-surface temperature gradient G2 of the silicon single crystal satisfy: G2/G1<6. In the continuous growing step, the step of controlling the temperature gradient of the silicon single crystal is repeated to obtain a silicon ingot single crystal.

In an embodiment of the present disclosure, the length of the silicon single crystal below the melt surface of the silicon melt along the axial direction is d1, the temperature of the silicon single crystal at the melt surface of the silicon melt is $T_s$, the temperature of the silicon single crystal at the growth interface is $T_m$, the under-surface temperature gradient G1 is $(T_m-T_s)/d1$, and the above-surface temperature gradient G2 is greater than the under-surface temperature gradient G1.

In an embodiment of the present disclosure, there is a growth interface between the silicon single crystal under the melt surface of the silicon melt and the low-temperature region. During the growth of the silicon single crystal, the silicon single crystal has a vacancy concentration distribution where the vacancy concentration is reduced along with the increase of the distance from the growth interface, as well as an interstitial silicon atom concentration distribution where the interstitial silicon atom concentration is reduced along with the increase of the distance from the growth interface. The under-surface temperature gradient G1 and the above-surface temperature gradient G2 are controlled such that in the vacancy concentration distribution and the interstitial silicon atom concentration, along with the increase of distance from the growth interface, the vacancy concentration and the interstitial silicon atom concentration in the silicon single crystal are reduced respectively and become close to each other accordingly. In an embodiment, there is an cross point between the vacancy concentration distribution and the interstitial silicon atom concentration distribution, the vacancy concentration of the silicon single crystal at the cross point is substantially equal to the interstitial silicon atom concentration, and the distance between the growth interface and the cross point is a critical distance Zc. In an embodiment, as G2/G1 increases, the critical distance Zc decreases. The temperature of the silicon single crystal at the cross point increases as G2/G1 increases.

In an embodiment of the present disclosure, the vacancy concentration of the silicon single crystal at the cross point is the vacancy equilibrium concentration $Cv^{eq}$, and the vacancy equilibrium concentration $Cv^{eq}$ decreases to be close to a vacancy concentration threshold $Cv_{min}$ as G2/G1 decreases. In an embodiment, when the under-surface temperature gradient G1 is higher, the minimum G2/G1 corresponding to the vacancy concentration threshold $Cv_{min}$ has the lower value.

In an embodiment of the present disclosure, the under-surface length of the silicon single crystal under the melt surface of the silicon melt along the axial direction is d1, and in the case with the same G2/G1, the critical distance Zc decreases along with the increase of the under-surface length d1. In an embodiment, in the case with the same under-surface length d1, when G2/G1 becomes larger, the critical distance Zc becomes smaller.

In an embodiment of the present disclosure, the vacancy concentration of the silicon single crystal at the cross point is the vacancy equilibrium concentration $Cv^{eq}$, and the under-surface length of the silicon single crystal under the melt surface of the silicon melt along the axial direction is d1. In the relationship graph showing the relationship between the vacancy equilibrium concentration $Cv^{eq}$ and the under-surface length d1, when the G2/G1 becomes larger, the slope of the vacancy equilibrium concentration $Cv^{eq}$ decreases more along with the increase of the under-surface length d1.

In an embodiment of the present disclosure, the under-surface temperature gradient G1 and the above-surface temperature gradient G2 of the silicon single crystal further satisfy the formula (2):

$$1<G2/G1<6 \qquad (2).$$

In an embodiment of the present disclosure, the under-surface temperature gradient G1 and the above-surface temperature gradient G2 of the silicon single crystal further satisfy the formula (3):

$$2<G2/G1<3 \qquad (3).$$

In an embodiment of the present disclosure, the continuous growing step further includes a step of adjusting the growth rate of the silicon ingot single crystal. In an embodiment, the growth rate in the silicon single crystal growing step is 0.0002 cm/s to 0.002 cm/s.

Based on the above, according to the present disclosure, since controlling the control factor for the manufacture of ultra-high-quality silicon ingot single crystal is mainly achieved by controlling the temperature gradients of the silicon single crystal above and underneath the melt surface of the silicon melt in two stages to satisfy a specific relationship, the manufacturing method of the silicon ingot single crystal of the disclosure basically does not require extremely precise and complex control of the temperature distribution and the pulling rate of the entire field near the growth interface. Accordingly, the manufacturing method of the silicon ingot single crystal of the present disclosure may be realized with versatility and good controllability for manufacturing silicon ingot single crystal with excellent quality.

Figure 5:
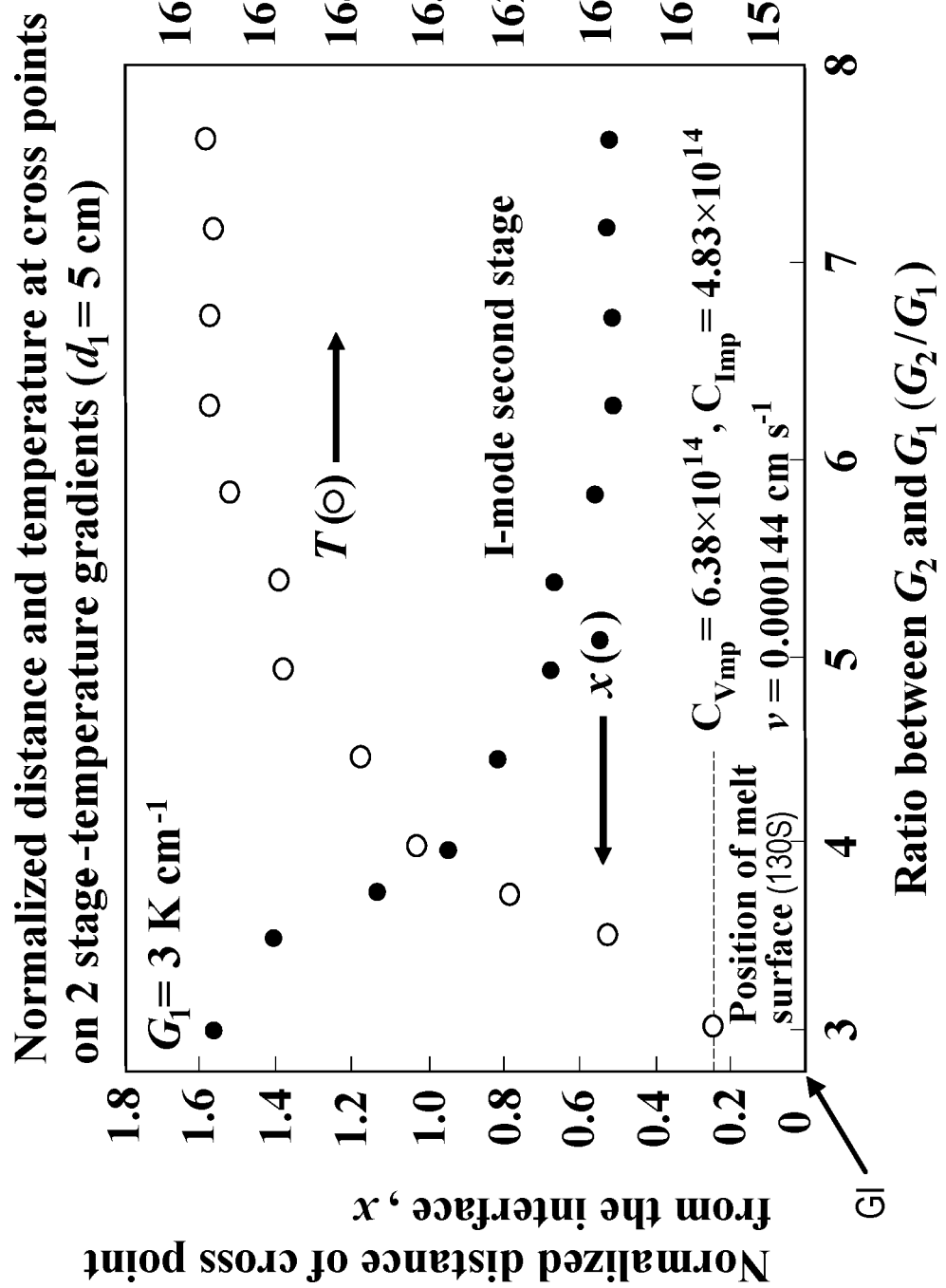

The solid-point curve in FIG. 5 corresponds to the value of the Y-axis on the left, which represents the distribution of a normalized distance between an cross point and the growth interface under different temperature gradient ratios in two stages, and the hollow-point curve in FIG. 5 corresponds to the value of the Y-axis on the right, which represents the temperature change distribution at the cross point under different temperature gradient ratios in two stages.

Figure 6:
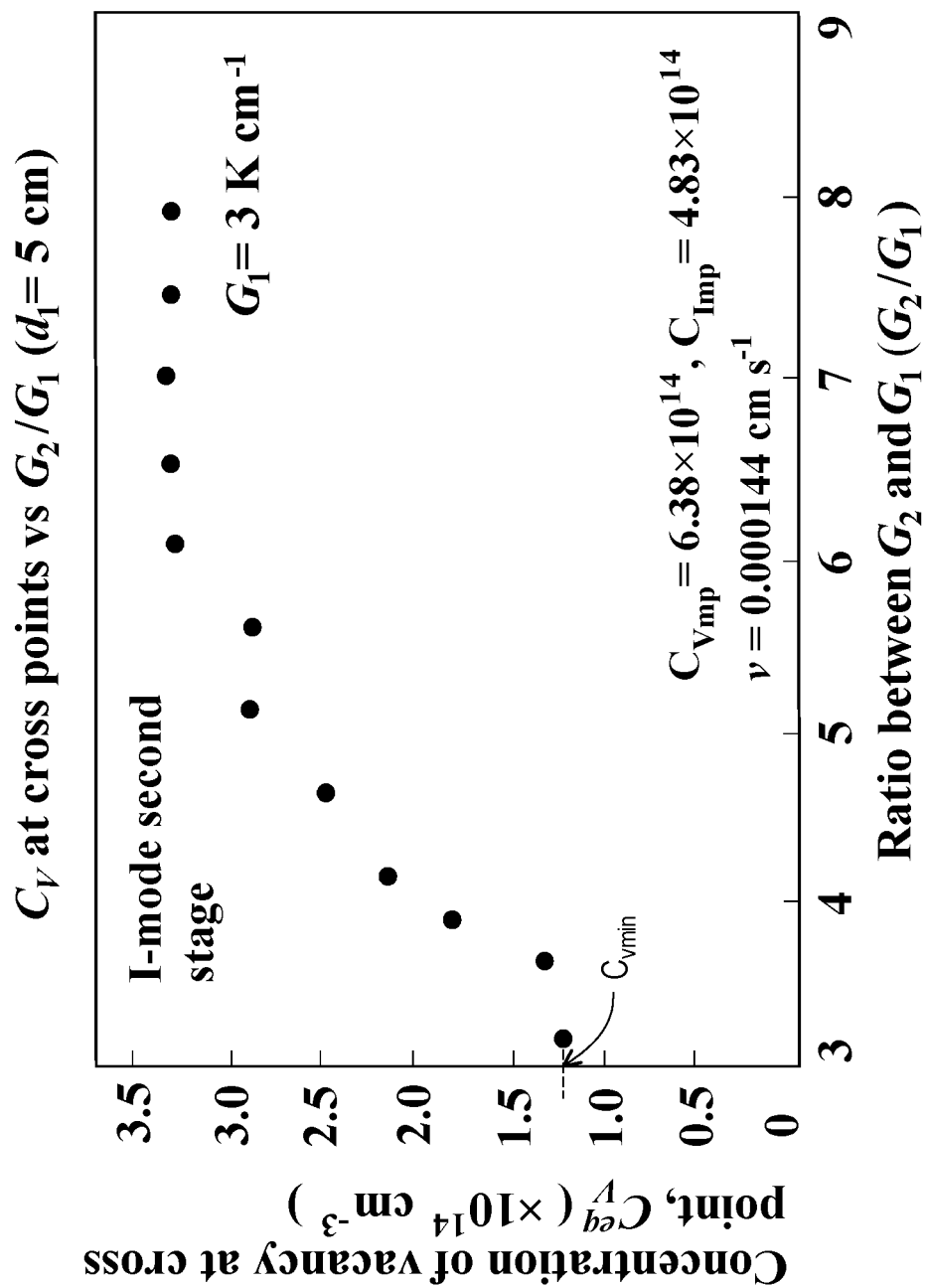

FIG. 6 is a schematic relationship diagram showing the vacancy concentration at the cross point that changes along with G2/G1 when G1 is 3 K cm$^{-1}$.

Figure 7:
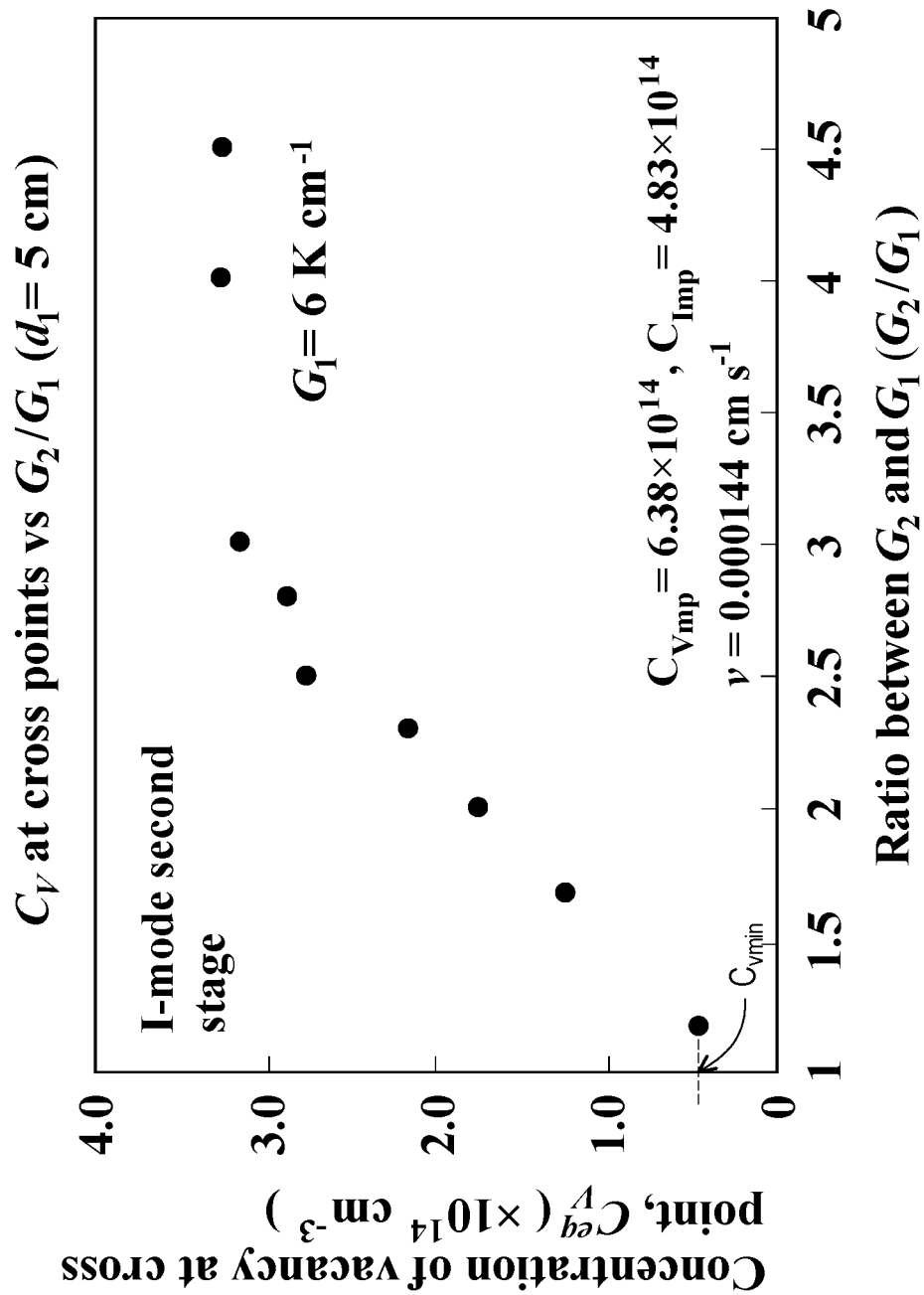

FIG. 7 is a schematic relationship diagram showing the vacancy concentration at the cross point that changes along with G2/G1 when G1 is 6 K cm$^{-1}$.

Figure 8:
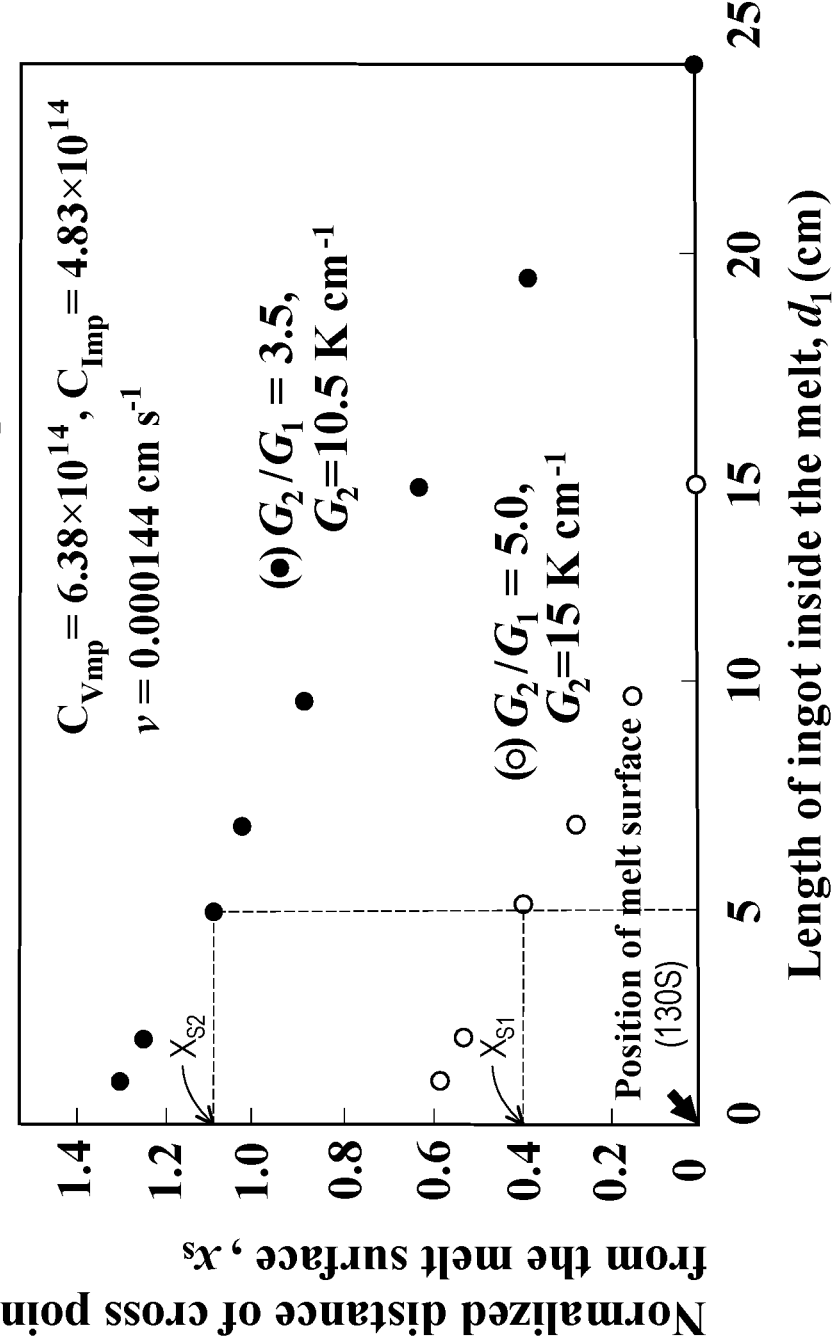

FIG. 8 is a schematic diagram showing the relationship between the normalized distance of the cross point and the under-surface length d1 of the silicon single crystal under different temperature gradient conditions in two stages.

Figure 9:
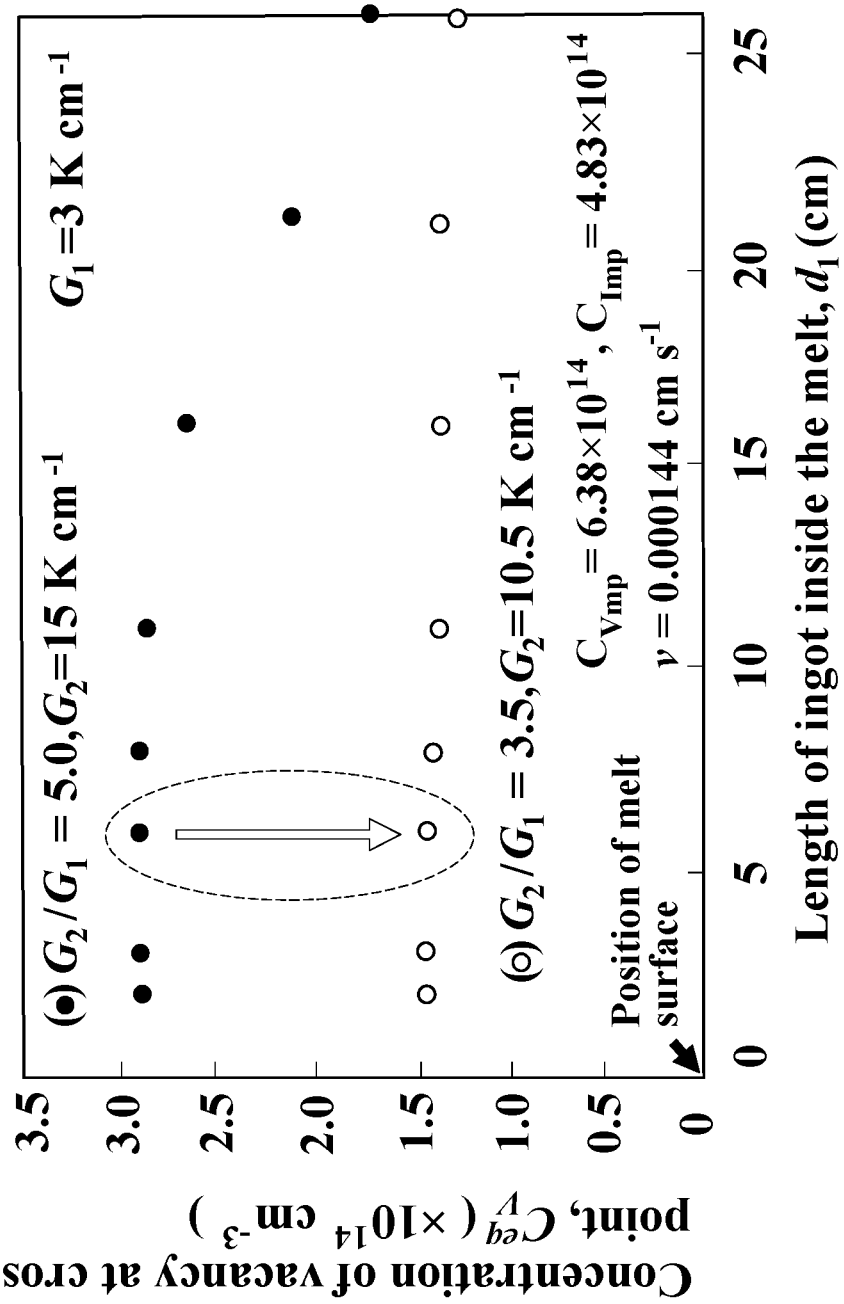

FIG. 9 is a schematic diagram showing the relationship between the vacancy equilibrium concentration at the cross point and the under-surface length d1 of the silicon single crystal when G1 is 3 K cm$^{-1}$ and G2/G1 and above-surface temperature gradient G2 are different.

Figure 10:
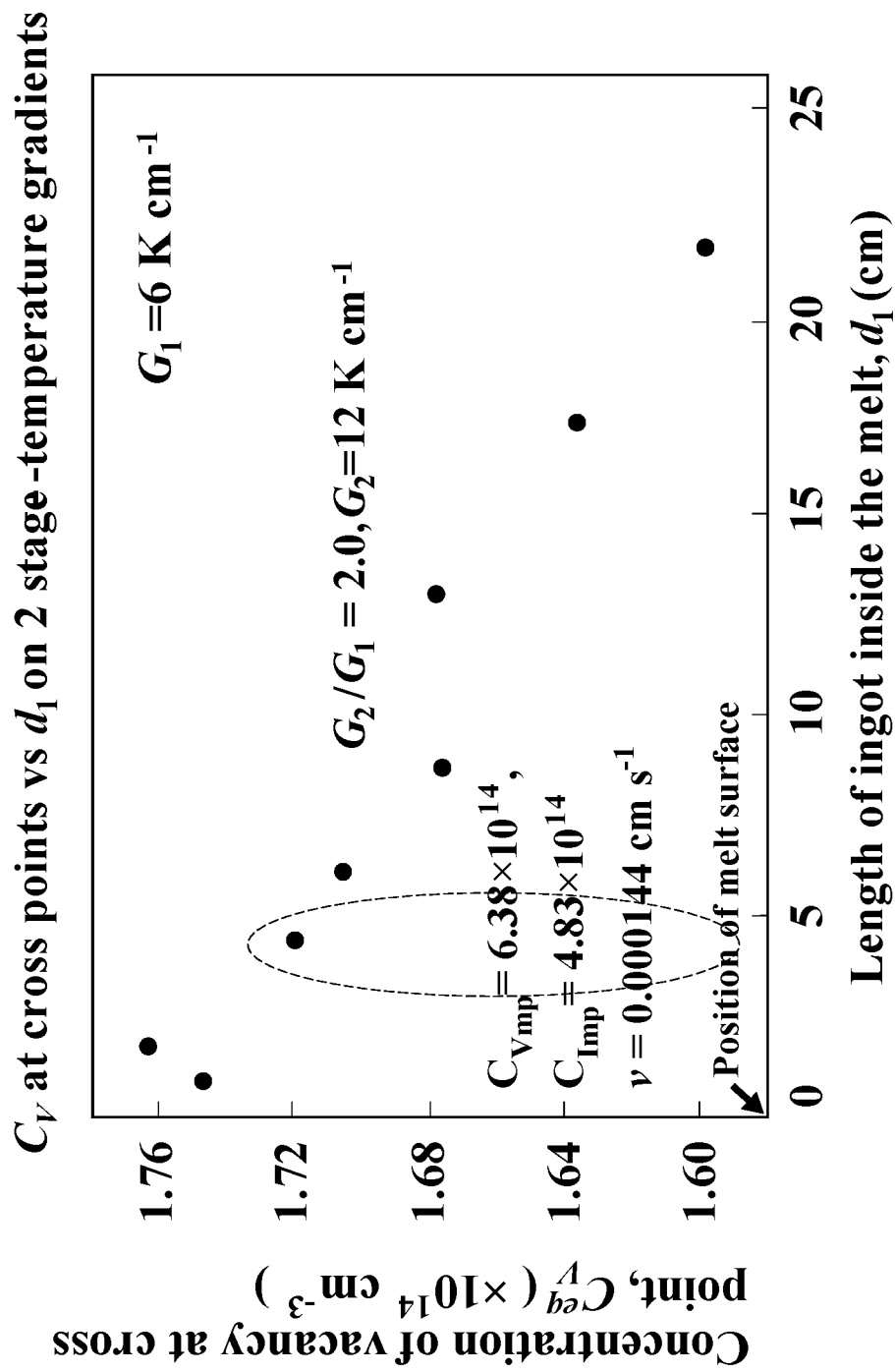

FIG. 10 shows a schematic diagram of the relationship between the vacancy equilibrium concentration at the cross point and the under-surface length d1 of the silicon single crystal under the condition that the under-surface temperature gradient G1 is 6 K cm$^{-1}$, the above-surface temperature gradient G2 is 12 K cm$^{-1}$, and G2/G1 is 2.0.

Figure 11:
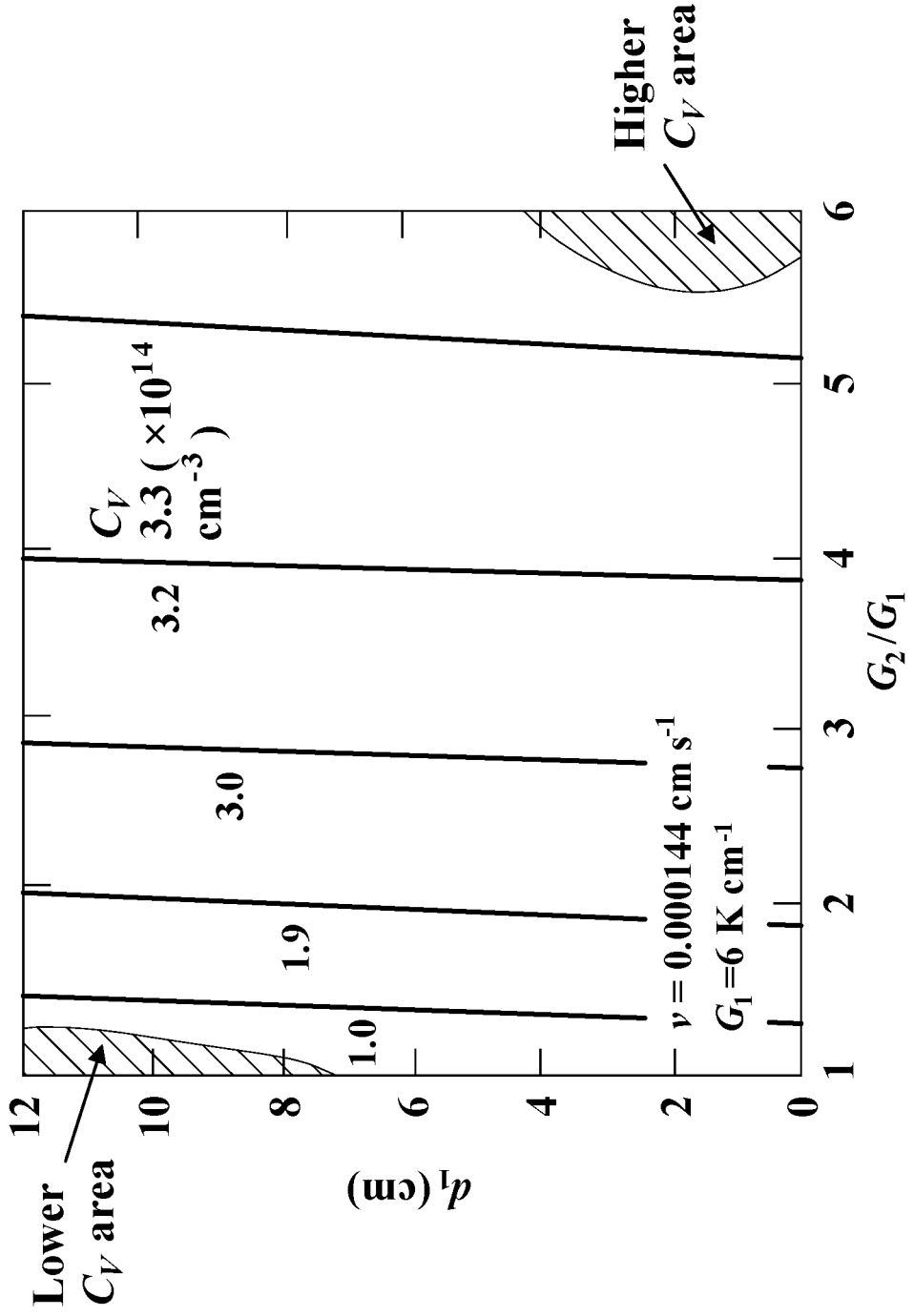

FIG. 11 is a schematic diagram showing a two-dimensional-distribution of the vacancy equilibrium concentration $Cv^{eq}$ at the cross point where G1 is 6 K cm$^{-1}$ and growth rate v is 0.000144 cm$^{s-1}$, where X-axis represents different G2/G1 ratios, while Y-axis represents the under-surface length d1 of the silicon single crystal.

Figure 12:
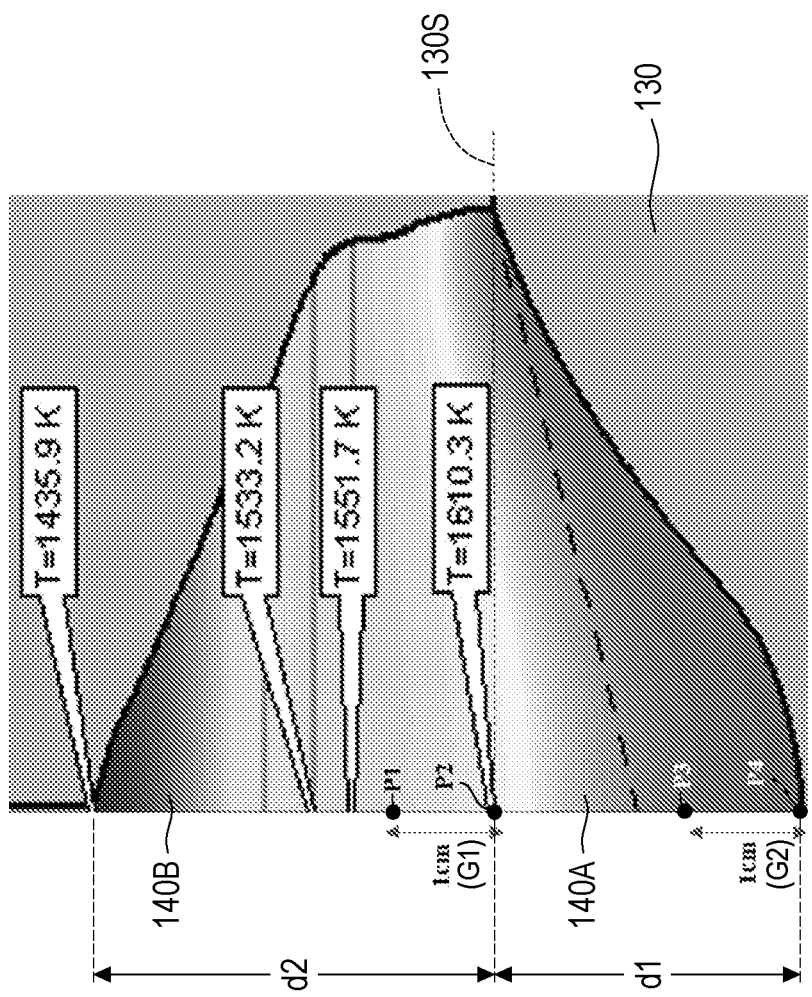

FIG. 12 is a schematic diagram of the silicon ingot single crystal in measurement of the temperature gradient above the melt surface of the silicon melt and the temperature gradient underneath the melt surface of the silicon melt in an embodiment of the present disclosure.

DESCRIPTION OF THE EMBODIMENTS

Figure 1:
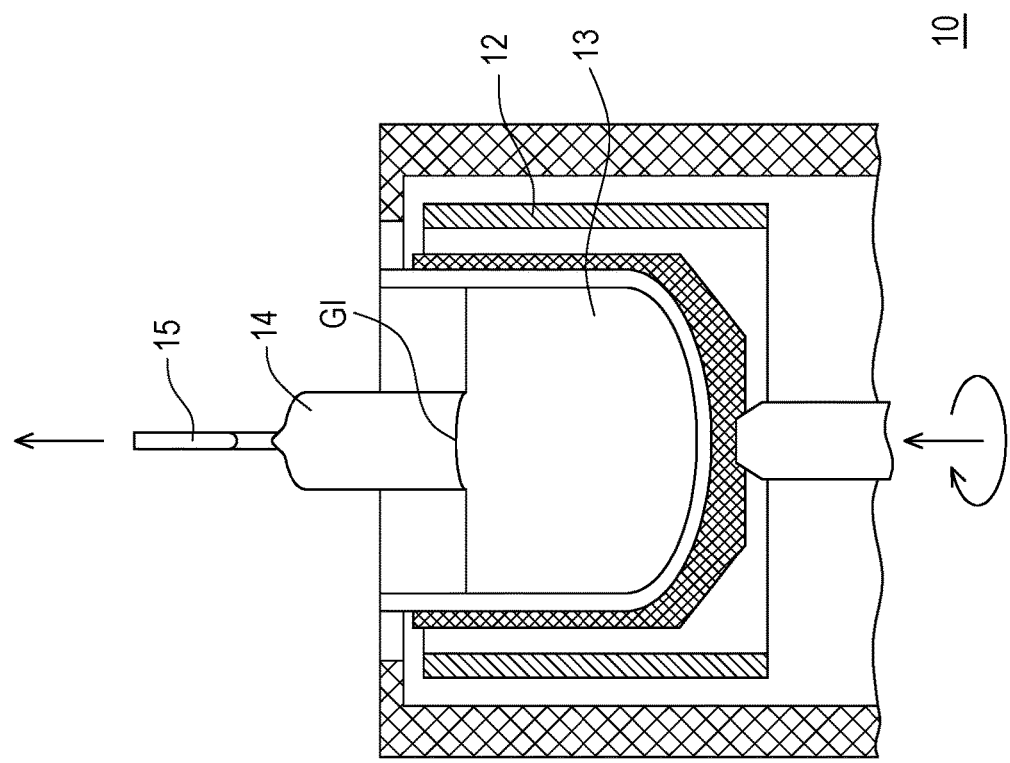
FIG. 1 is a schematic diagram of a conventional manufacturing device for growing silicon ingot single crystal by using a CZ growing method.
Figure 2:
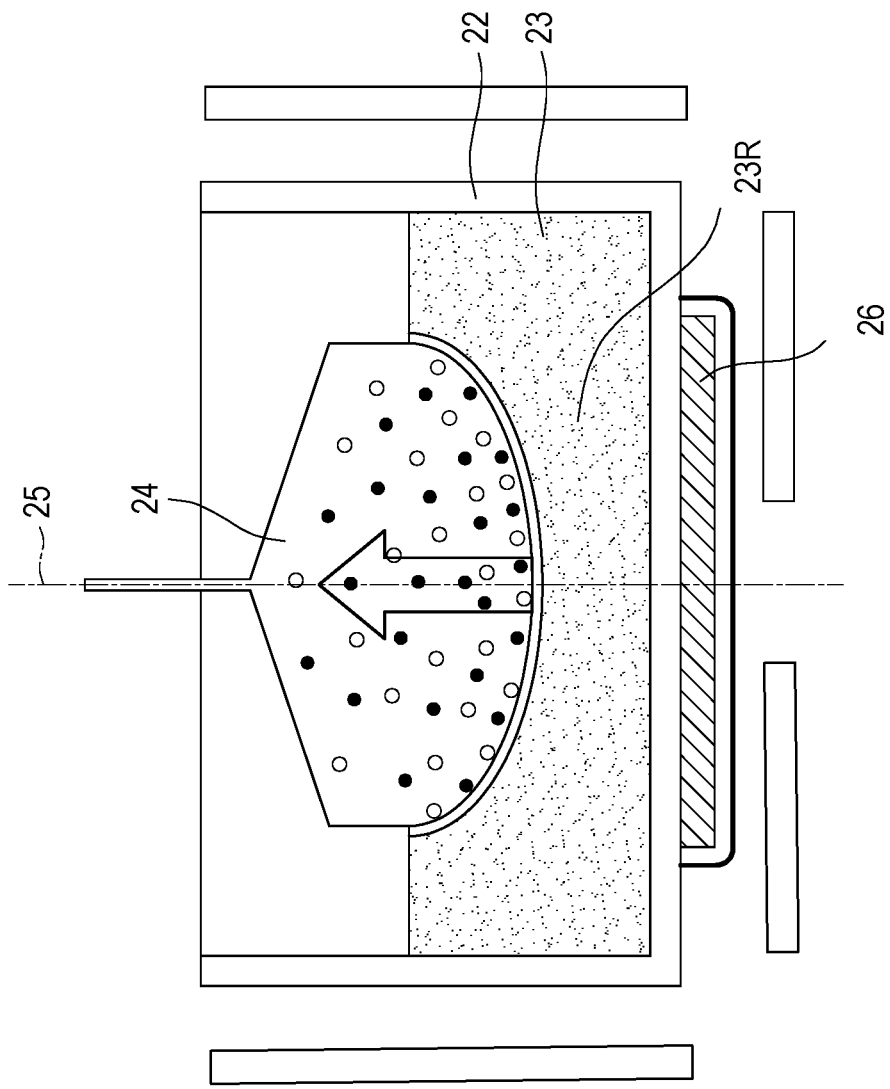
FIG. 2 is a schematic diagram of a conventional manufacturing device for growing silicon ingot single crystal by using an NOC method.
Figure 3:
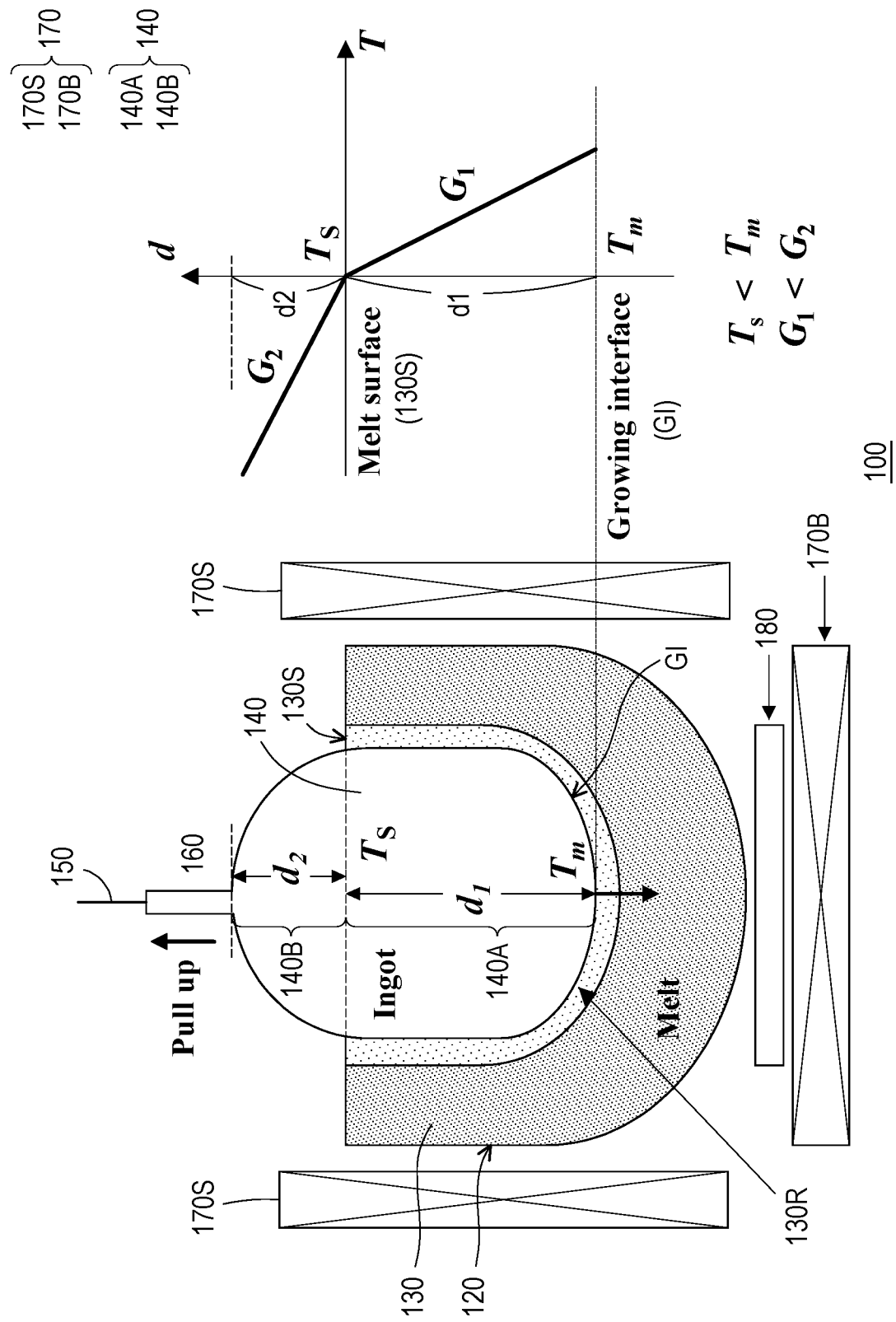
FIG. 3 is a schematic diagram of an NOC method in an embodiment of the present disclosure.

FIG. 3 is a schematic diagram of an NOC method in an embodiment of the present disclosure.

Referring to the left side of FIG. 3, the manufacturing device 100 for growing silicon ingot single crystal by NOC method of the present embodiment includes a crucible 120, a liquid silicon melt 130 disposed in the crucible 120, a silicon ingot single crystal 140 grown in the silicon melt 130 and a pulling mechanism 150 for pulling the grown silicon ingot single crystal, a seed crystal 160, and a temperature gradient controller 170. The temperature gradient controller 170 includes a bottom heater 170B and a lateral heater 170S. In this embodiment, a large and deep low-temperature region 130R may be effectively established in the central portion of the silicon melt 130 by using an insulator 180 disposed under the bottom of the crucible 120.

Based on the established theoretical basis, the inventor(s) of the disclosure has conducted further intensive research on the temperature gradient, focusing on the temperature gradient of the growing silicon single crystal, and dividing the temperature gradient of the silicon single crystal into an under-surface temperature gradient G1 under the melt surface 130S of the silicon melt 130 and an above-surface temperature gradient G2 above the melt surface 130S of the silicon melt 130. The inventor(s) of the disclosure provides a more specific simulation model to calculate the effect of temperature gradient on the distribution of point defects in silicon ingot single crystal.

Specifically, the right side of FIG. 3 correspondingly shows the temperature gradient distributions of the grown silicon single crystal above and underneath the melt surface of the silicon melt, the X-axis represents the temperature, the Y-axis represents the length of the silicon single crystal along the pulling axis, and X/Y represents the temperature gradient. When the melt surface of the silicon melt is set as the origin as shown on the right side of FIG. 3, the length above the cross point of the X-axis and Y-axis on the right side of FIG. 3 represents the length of the grown silicon single crystal above the melt surface of the silicon melt, and the length below the cross point of the X-axis and Y-axis represents the length of the grown silicon single crystal underneath the melt surface of the silicon melt.

As shown in FIG. 3, in the manufacturing device 100 adopted in NOC method, a temperature gradient controller 170 including a bottom heater 170B and a lateral heater 170S may be utilized to establish a thermal field structure in the silicon melt 130, such that the silicon melt 130 produces a larger range in the central area of the crucible 120, and the temperature is lower than the low-temperature region 130R around the crucible 120. Specifically, in the low-temperature region 130R, the temperature of the silicon melt is maintained between the freezing point (Fp is about 1410° C.) and the melting point (Mp is about 1414° C.) of silicon. The low-temperature region 130R allows natural crystal growth therein. Moreover, the left side of FIG. 3 only schematically depicts the low-temperature region 130R, but the boundary thereof is not limited thereto.

For example, on the left side of FIG. 3 along the direction of the pulling axis, the growth interface marked with G1 is marked as the growth interface, but its boundaries are not limited thereto.

Please continue to refer to FIG. 3, nucleation is generated on the melt surface of the silicon melt 130 using a silicon seed crystal 160. The silicon seed crystal 160 contacts the melt surface of the silicon melt 130 to start crystal growth, and a silicon single crystal grows along the melt surface of the silicon melt 130 and toward the interior of the silicon melt 130. More specifically, FIG. 3 is a schematic diagram showing the distribution of length and temperature of the grown silicon single crystal at a specific time point. As shown on the left side of FIG. 3, the length of the lower part 140A of the silicon single crystal grown below the melt surface of the silicon melt 130 is d1, and the length of the upper part 140B of the silicon single crystal grown above the melt surface 130S of the silicon melt 130 is d2. The lower part 140A of the silicon single crystal continues to grow on the growth interface G1 in contact with the low-temperature region 130R. During the growth of the silicon single crystal 140, the growth interface G1 moves dynamically. Moreover, the grown silicon single crystal 140 is pulled by the pulling mechanism 150 in a slow and controlled manner.

As shown on the right side of FIG. 3, the temperature of the lower part 140A of the silicon single crystal at the growth interface G1 is substantially close to the melting point $T_m$, and the temperature of the lower part 140A of the silicon single crystal and the upper part 140B of the silicon single crystal at the cross point of the melt surface 130S along the extension axis is $T_s$. In the present disclosure, on basis of Patent Document 2 (Taiwan Patent Publication No. TW202144628A), the inventor(s) further explored the influence of the temperature gradient of the silicon single crystal on the growth of the ultra-high-quality silicon ingot single crystal during the growth of the silicon ingot single crystal.

In more detail, in the NOC method, for the silicon single crystal 140 in the growth process, the melt surface 130S of the silicon melt 130 is taken as a boundary, and the under-surface temperature gradient G1 of the lower part 140A of the silicon single crystal and the above-surface temperature gradient of the upper part 140B of the silicon single crystal are controlled. Based on the defect formation mechanism constructed in the following description, the inventor(s) found through theoretical calculation and verification that in the growing step of the silicon single crystal, by making the under-surface temperature gradient G1 and the above-surface temperature gradient G2 of the silicon single crystal to satisfy the formula (1): G2/G1<6, it is possible to effectively improve the dynamic equilibrium between diffusion of point defects during the growth of silicon single crystal, so that the vacancy and interstitial silicon atoms may be annihilated more efficiently in pairs.

Specifically, the length of the silicon single crystal under the melt surface of the silicon melt along the axial direction is d1, the temperature of the silicon single crystal at the melt surface of the silicon melt is $T_s$, the temperature of the silicon single crystal at the growth interface is $T_m$, and the under-surface temperature gradient G1 is obtained through $(T_m - T_s)/d1$. In an embodiment, the above-surface temperature gradient G2 is greater than the under-surface temperature gradient G1. Under the circumstances, formula (1) further satisfies formula (2): 1<G2/G1<6.

The manufacturing method of the silicon ingot single crystal of the present disclosure manufactures the silicon ingot single crystal by an NOC method, including (1) a growing step of the silicon ingot single crystal, (2) a control step of controlling the temperature gradient of the silicon single crystal, and (3) a continuous growing step.

In (1) a growing step of the silicon ingot single crystal, as shown in FIG. 3, the silicon ingot single crystal 140 is grown in the silicon melt 130 in the crucible 120. Specifically, the growing step of the silicon ingot single crystal includes (1-1) providing a low-temperature region 130R in the silicon melt 130 and providing a silicon seed crystal 160 to contact the melt surface of the silicon melt 130 to start crystal growth. As shown in FIG. 3, the silicon single crystal 140 grows along the melt surface 130S of the silicon melt 130. After growing for a period of time, the upper part 140B of silicon single crystal with a length d2 grows on the melt surface 130S. On the other hand, when the silicon single crystal 140 grows on the surface, the silicon single crystal 140 also grows toward the inside of the silicon melt 130 simultaneously. After growing for the same period of time, a lower part 140A of the silicon single crystal with a length d1 grows under the melt surface 130S.

It should be noted that, in the present disclosure, in (2) a control step of controlling the temperature gradient of the silicon single crystal, the under-surface temperature gradient of the lower part 140A of the silicon single crystal underneath the melt surface 130S of the silicon melt 130 is controlled to be G1, and the above-surface temperature gradient of the upper part 140B of the silicon single crystal exposed on the melt surface 130S of the silicon melt 130 is controlled to be G2, and during the growth process, the under-surface temperature gradient G1 and the above-surface temperature gradient G2 of the lower part 140A of the silicon single crystal satisfy formula (1): G2/G1<6. In this manner, the dynamic equilibrium between the diffusion of point defects may be effectively improved during the growth process of the silicon single crystal, so that the vacancy and the interstitial silicon atoms may be annihilated more efficiently in pairs.

In (3) a continuous growing step, the controlling step (2) for controlling the temperature gradient of the silicon single crystal is repeated to obtain a silicon ingot single crystal.

Based on the above, as shown in FIG. 3, in the manufacturing method of the silicon ingot single crystal of the present disclosure, during the NOC process, through the constructed concentration distribution of the vacancy concentration $C_V$ and the interstitial silicon atom concentration $C_I$, as well as the G2/G1 ratio between the above-surface temperature gradient G2 and the under-surface temperature gradient G1 that satisfy a specific relationship, it is possible to manufacture ultra-high-quality silicon ingot single crystals.

In view of the above technical problems, the inventor(s) of the present disclosure initially constructed a distribution model that is constructed for the silicon ingot single crystal grown in the NOC method to balance vacancy and interstitial silicon atoms in Patent Document 2 (Taiwan Patent Publication No. TW202144628A). Based on the previous theoretical model and calculation of NOC method, the following (A) to (E) are further explored:

(A) The vacancy concentration $C_V(z)$ and the interstitial silicon atom concentration $C_I(z)$ in the silicon single crystal are calculated by using Voronkov's profile.

The vacancy concentration $C_V(z)$ and the interstitial silicon atom concentration $C_I(z)$ may simply be set as a function of the distance z (cm) from the growth interface. The $C_V(z)$ and $C_I(z)$ after pair-annihilation are governed by the law of mass action in equilibrium:

$$C_V(z)C_I(z) = C_V^{eq}(z)C_I^{eq}(z) \tag{1}$$

$C_V^{eq}(z)$ and $C_I^{eq}(z)$ are the vacancy equilibrium concentration and interstitial silicon atom equilibrium concentration, respectively.

As described in Patent Document 2 (Taiwan Patent Publication No. TW202144628A), the vacancy equilibrium concentration $C_V^{eq}(z)$ (cm$^{-3}$) may be expressed as the following formulas (2) and (3):

$$C_V^{eq}(z) = C_{V_{mp}}^{eq} \exp(-E_V^f G_0 z / k_B T_m^2) \tag{2}$$

$$C_I^{eq}(z) = C_{V_{mp}}^{eq} \exp(-E_I^f G_0 z / k_B T_m^2) \tag{3}$$

In the formula, $C_V$ mp and $C_I$ mp are the vacancy equilibrium concentration and the interstitial silicon atom equilibrium concentration when the growth interface is $T_m$, respectively, $E_V^f$(ev) and $E_I^f$(ev) are the formation energies of vacancy and interstitial silicon atom, respectively, and $k_B$ is the Boltzmann constant (=8.617×10−5 eVK$^{-1}$=1.38×10$^{-16}$ erg K$^{-1}$).

The flux of vacancy and the flux of interstitial silicon atom may be expressed as the following formulas (4) and (5), respectively:

$$J_V(z) = -D_{V_{mp}} \partial C_V(z)/\partial z - G(D_{V_{mp}} Q_V^* C_V(z)/k_B T^2) + vC_{V_{mp}}^{eq} \tag{4}$$

$$J_I(z) = -D_{I_{mp}} \partial C_I(z)/\partial z - G(D_{I_{mp}} Q_I^* C_I(z)/k_B T^2) + vC_{I_{mp}}^{eq} \tag{5}$$

In the formula, $C_{V\ mp}^{eq}$ and $C_{I\ mp}^{eq}$ are the diffusion-equilibrium concentration of vacancy and interstitial silicon atom and the interstitial silicon atom equilibrium concentration, $E_V^f$(ev) and $E_I^f$(ev) are the formation energies of vacancy and interstitial silicon atom, respectively, and $k_B$ is the Boltzmann constant (=8.617×10$^{-5}$ eVK$^{-1}$=1.38×10$^{-16}$ erg K$^{-1}$). $D_{V\ mp}$ and $D_{I\ mp}$ (cm$^2$ s$^{-1}$) are the diffusion constant of vacancy and the diffusion constant of interstitial silicon atom, respectively, G is the temperature gradient (dT/dz), and v (cm s$^{-1}$) is the growth rate of growing toward the silicon melt, $Q_V^*$ and $Q_I^*$ are the transfer heat of vacancy and the transfer heat of interstitial silicon atom, respectively. The third terms of v $C_{V\ mp}^{eq}$ and v $C_{I\ mp}^{eq}$ are convective terms due to defect transportation by a moving crystal. The adopted parameters are as follows, and the adopted parameters are determined based on Nakamura's doctoral dissertation (K. Nakamura, S. Maeda, S. Togawa, T. Saishoji, J. Tomioka, High Purity Silicon VI, PV2000-17, (2000) 31.) and the thesis (K. Nakamura, Doctoral thesis for Tohoku University, "Study of Diffusion of Point Defects in a Single Crystal of Silicon during Growth Process and Formation of Secondary Defects", Chapter 3, Table 3-5, 2002). These parameters are listed in Table 1:

TABLE 1

| | |
|---|---|
| $C_{V_{mp}}^{eq} = 6.38 \times 10^{14}$ cm$^{-3}$ | $E_V^m = 0.3$ eV |
| $C_{I_{mp}}^{eq} = 4.83 \times 10^{14}$ cm$^{-3}$ | $E_I^m = 0.9$ eV |
| $D_{V_{mp}} = 4.5 \times 10^{-5}$ cm$^2$ s$^{-1}$ | $E_V^f = 3.94$ eV |
| $D_{I_{mp}} = 5.0 \times 10^{-4}$ cm$^2$ s$^{-1}$ | $E_I^f = 4.05$ eV |
| $D_{V_{mp}} C_{V_{mp}}^{eq} = 2.87 \times 10^{10}$ cm$^2$ s$^{-1}$ | $Q_V^* = -0.50$ $E_V^f$ |
| $D_{I_{mp}} C_{I_{mp}}^{eq} = 2.41 \times 10^{11}$ cm$^2$ s$^{-1}$ | $Q_I^* = 0.25$ $eVE_I^f$ |

At the steady-state, $$J = J_I(z) - J_V(z) = \text{const} \tag{6}$$

The above formula (1) and formula (6) should be satisfied at the same time. To resolve this relationship, a basic equation may be derived from Voronkov's profile, since this interpretation can simply give a qualitative trend of the distribution of point defects near the growth interface, the relationship between the concentration of point defects may be obtained as follows:

$$\begin{aligned} J &= vCs \\ &= -(EG_0/k_BT^2)(D_{Imp}dK(x)Y/dx - D_{Vmp}d(K(x)/Y)/dx) + \\ &\quad vK(x)(Y - 1/Y) - (G_0K(x)/k_BT^2)D_{Imp}Q_I^*Y - D_{Vmp}Q_V^*/Y) \end{aligned} \tag{7}$$

In the formula, Cs is called the incorporated concentration difference. $E = (E_V^f + E_I^f)/2$, $K(x) = K_m \exp(-x)$, $K_m = K(T_m) = \sqrt{(C_{V_{mp}}^{eq} C_{I_{mp}}^{eq})}$, $Y = \sqrt{(C_I(z)/C_V(z))}$, and $x = (E/k_B)(1/T - 1/T_m) = z/L$. $1/L = E \cdot G_0/k_BT_m^2$.

The drift term is easily affected by T, and the above formula (7) may be expressed as follows:

$$(D_{I_{mp}}Y + D_{Vmp}/Y)(d \log x/dx) = (D_{I_{mp}}Y + D_{Vmp}/Y) + v(dz/dr)(Y - 1/Y - Cs/K(x)) + (D_{I_{mp}}Q_I^*Y - D_{Vmp}Q_V^*/Y)/E \tag{8}$$

Formula (8) may be expressed as follows:

$$dY/dx = f(x) = \left\{ \left( v\frac{k_BT^2}{EG_0} \right)\left( Y - \frac{1}{Y} - \frac{Cs}{K(x)} \right) + \left( D_{Imp}Y - \frac{D_{Vmp}}{Y} \right) + (D_{Imp}Q_I^*Y - D_{Vmp}Q_V^*/Y)E \right\} Y/(D_{Imp}Y + D_{vmp}/Y) \tag{9}$$

The formula (8) may be solved numerically by the following two procedures. The first numerical method is the numerical method of approximation from x=0, and the initial Y(0) may be determined in a single deterministic way $Y(0) = \sqrt{C_{I_{mp}}^{eq}/C_{V_{mp}}^{eq}} = 0.87$. dY(x) corresponding to dx may be determined as $dY(x) = f(x)dx$. An accurate qualitative trend may be calculated near the growth interface, but the error tends to increase further away from the growth interface. This is a calculation that extrapolates from the growth interface.

The second numerical method is the numerical method from x=xend to the growth interface x=0, and xend is the position away from the growth interface. The initial Y(xend) cannot be determined in a single way. Therefore, $C_{V_{mp}}^{eq}$ and $C_{I_{mp}}^{eq}$ are adopted to assume a reasonable value. As a tentative initial value of Y(xend), the following expression may be obtained:

In a V-rich (where vacancy is more than interstitial silicon atom) region:

$$Y(x_{end}) = K(x_{end})/(C_{V_{mp}}^{eq} - C_{I_{mp}}^{eq})/2 \tag{10}$$

In an I-rich (where interstitial silicon atom is more than vacancy) region:

$$Y(x_{end}) = C_{I_{mp}}^{eq}/2K(x_{end}) \tag{11}$$

Therefore, the final point from the growth interface is uniquely determined prior to the calculation. The calculation results show a qualitative tendency to interpolate between the initial point and the final point.

The concentration distributions of $C_V(z)$ and $C_I(z)$ at the cross point may be calculated using the above two numerical solution procedures. When using formula (1), $C_V(z)$ and $C_I(z)$ may be obtained as follows:

$$Cv(x) = \frac{C_V^{eq}(x)C_I^{eq}(x)}{C_I(x)} = K(x)/Y(x) \tag{12}$$

$$C_I(x) = C_V^{eq}(x)C_I^{eq}(x)/Cv(x) = K(x)Y(x) \tag{13}$$

(B) The cross point of the vacancy concentration $C_V$ of the I-rich region near the critical point of the Voronkov's profile and the interstitial silicon atom concentration $C_I$ The first numerical method described above is utilized to estimate $C_V(x)$, $C_I(x)$ and the cross point and critical point in the I-rich region. In this case, Cs is set to a very small value, which is 0.1 from the I-rich region, and −0.1 from the V-rich region to prevent divergence of the estimated value. This condition is satisfied near the critical point of $J = J_I(z) - J_V(z) = 0$. The $(v/G)_{Cr}$ at the critical point may be expressed as:

$$(v/G)cr = \{D_{I_{mp}}C_{I_{mp}}^{eq}(E-Q_I^*) - D_{V_{mp}}C_{V_{mp}}^{eq}(E-Q_V^*)\}/\{k_BT_m^2(C_{V_{mp}}^{eq} - C_{I_{mp}}^{eq})\} \tag{14}$$

In formula (14), $(v/G)_{Cr} = 2.23 \times 10^{-5}$ cm$^2$K$^{-1}$s$^{-1}$ without drift term, and $(v/G)_{Cr} = 1.44 \times 10^{-5}$ cm$^2$K$^{-1}$s$^{-1}$ with drift term.

(C) The Cs concentration of I-rich region and V-rich region is determined by using G0.

The above second numerical method is utilized to estimate Cs, $C_V(x)$, and $C_I(x)$ over a wide range of x. During this process, x=6 is used as the value of initial xend. Like the first numerical method, the final point of the growth interface is uniquely determined prior to the calculation. The calculation results show a qualitative tendency to interpolate between the initial point and the final point.

Figure 4:
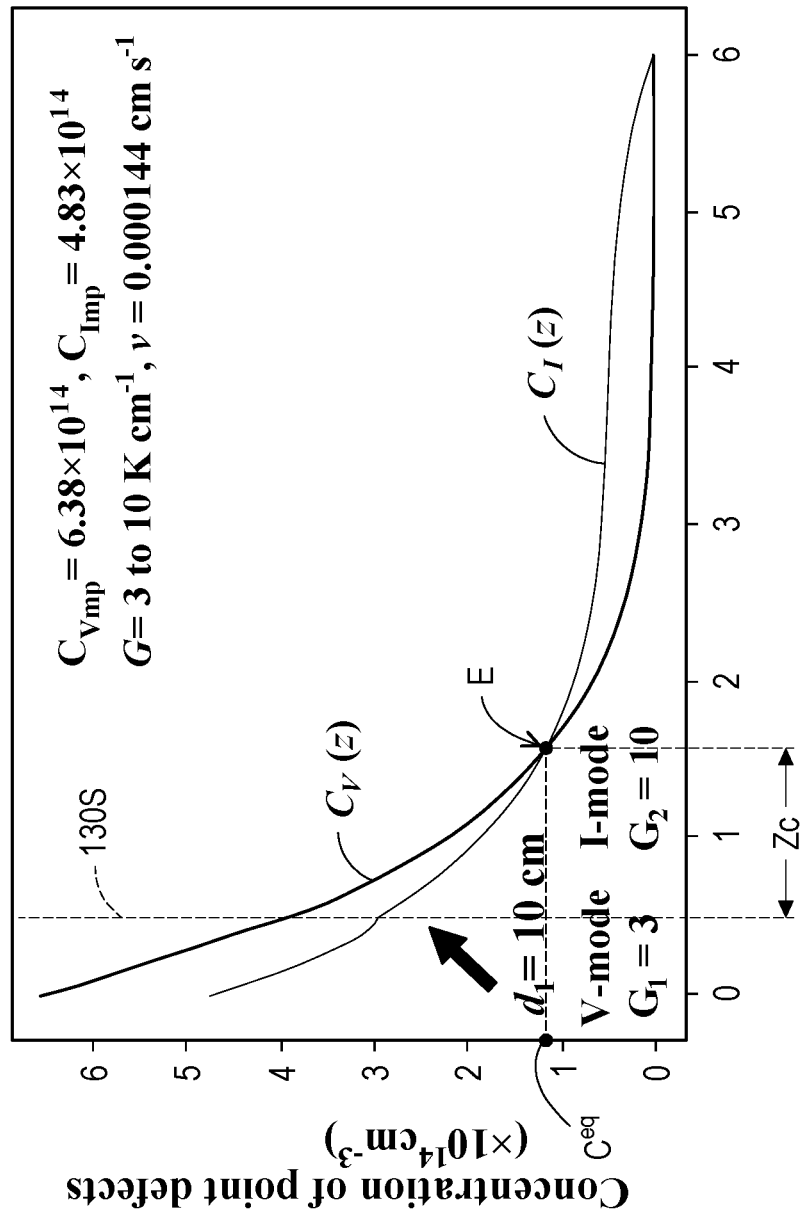
FIG. 4 is a graph showing the concentration distributions of $C_V(z)$ and $C_I(z)$ that change along with the distance z from the growth interface when the temperature gradients are 3 and 10 K cm$^{-1}$ in two stages in the NOC method.

At the critical point, the curve distributions of concentrations of both $C_V(x)$ and $C_I(x)$ have a tendency to decrease towards a rather small value as the distance from the growth interface increases, as shown in FIG. 4. Such a tendency is very useful for NOC growth, and residual point defects may be reduced by controlling G0 and v.

It can be obtained from formula (7) that Cs is a function of G0 and v. This value may be estimated from x=xend to the growth interface x=0. First, an appropriate Cs is given, and a tentative Y(0) is estimated using the second numerical method. This process is repeated until the correct Y(0)=0.87 is obtained.

(D) Expressing vacancy concentration $C_V$ and interstitial silicon atom concentration $C_I$ over two stages of temperature gradients in NOC growth using linear T-curve As shown in FIG. 3, since the temperature gradients G1 and G2 of the dynamically grown silicon single crystal 140 are dramatically changed at the melt surface 130S of the silicon melt 130 during the NOC process, the inventor(s) of the disclosure have considered the above-mentioned technical issues in this case, and therefore controls the temperature gradient of the silicon single crystal in the NOC growth separately with the melt surface as the boundary. The under-surface temperature gradient G1 of the lower part 140A of the silicon single crystal and the above-surface temperature gradient G2 of the upper part 140B of the silicon single crystal are controlled respectively, as shown in FIG. 3.

A linear T-curve is useful when using G to represent steep temperature changes of a silicon single crystal in the middle. For a linear T profile, the $(v/G)_{Cr}$ at the critical point may be expressed as:

$$(v/G)_{cr} = -[ET_m^2 \exp\{-EGz/(k_B T_m(T_m-Gz))\}(D_{I\ mp} C_{I\ mp}^{eq} - D_{Vmp}C_{V\ mp}^{eq}) + (T_m-Gz)^2(D_{I\ mp}Q_I^* C_{I\ mp}^{eq} - D_{Vmp}Q_V^*C_{V\ mp}^{eq})]/\{k_B T_m^2(T_m-Gz)^2(C_{V\ mp}^{eq} - C_{I\ mp}^{eq})\}. \quad (15)$$

In formula (15), at z=0.5 cm, $(v/G)_{Cr}$2.07×10$^{-5}$ cm$^2$K$^{-1}$s$^{-1}$. Therefore, when G=10 Kcm$^{-1}$, v=0.000207 cm s$^{-1}$. For a linear T profile, the above formula (9) may be expressed as follows:

$$dY/dx = \quad (16)$$

$$f(x) = [(D_{Imp}Y - D_{Vmp}/Y) + (1.0/(dx/dx))\{v(Y - 1/Y - Cs/K(x)) - (G/k_B T^2 E)(D_{Imp}Q_I^*Y - D_{Vmp}Q_V^*/Y)\}]/(D_{Imp} + D_{Vmp}/Y^2),$$

Specifically, $1.0/(dx/dz) = k_B T_m^2 E/(G(E + k_B T_m x)^2)$ (17)

When using the second numerical method described above, two calculation stages are required to express the overall profile of the vacancy concentration $C_V(z)$ and the interstitial silicon atom concentration $C_I(z)$ as a function of x. For a linear T profile, x may be expressed as a function of z as follows:

$$x = EGz/(k_B T_m(T_m-Gz)) \quad (18)$$

FIG. 4 shows the relationship between the vacancy concentration $C_V(z)$ and the interstitial silicon atom concentration $C_I(z)$ as a function of x in temperature gradients at two stages where G1=3 and G2=10. FIG. 4 shows the V-mode from the growth interface (x=0) to x=0.5 (z=10 cm) and the I-mode from x=0.5 to x=6. Cs in a V-mode from 1.0×10$^{14}$ cm$^3$, and Cs in a V-mode of 0.5×10$^{14}$ cm$^3$.

FIG. 4 is a graph showing the concentration distributions of $C_V(z)$ and $C_I(z)$ that change along with the distance z from the growth interface when the temperature gradients are 3 and 10 K cm$^{-1}$ in two stages in the NOC method. As shown in FIG. 4, in the process of growing the silicon single crystal, the silicon single crystal has a vacancy concentration distribution $C_V$ where the vacancy concentration decreases as the distance from the growth interface increases, and has an interstitial silicon atom concentration distribution $C_I$ where the interstitial silicon atom concentration decreases as the distance from the growth interface increases. The under-surface temperature gradient G1 and the above-surface temperature gradient G2 are controlled, so that in the vacancy concentration distribution and the interstitial silicon atom concentration distribution, as the distance from the growth interface increases, the vacancy concentration and the interstitial silicon atom concentration in the silicon single crystal are reduced respectively and become close to each other accordingly.

More specifically, the dashed line marked 130S in FIG. 3 represents the position of the melt surface 130S of the silicon melt 130, and 0 at the X-axis represents the position of the growth interface G1. The Y-axis in FIG. 4 represents the vacancy concentration and the interstitial silicon atom concentration. As can be seen from FIG. 4, due to the pair-annihilation in the growth process, the vacancy concentration and the interstitial silicon atom concentration are respectively reduced simultaneously as moving away from the growth interface and both nearly reach zero.

In addition, as shown in FIG. 4, at a certain time point and position, the vacancy concentration $C_V(z)$ is equal to the interstitial silicon atom concentration $C_I(z)$, as shown in the equilibrium point E, the cross point where the concentrations are equal is called the concentration balance point $C^{eq}$. In other words, at this equilibrium point E, the vacancy concentration is equal to the interstitial silicon atom concentration in theory. Under the circumstances, the distance between the growth interface and the cross point is the critical distance Zc (the X-axis in FIG. 4 indicates that Zc is normalized distance x).

(E) Two-dimensional distribution of the ratio of silicon crystal length to the temperature gradients at two stages in NOC growth on the vacancy concentration $C_V$ at the cross point The position of cross point of curve distribution of the vacancy concentration $C_V$ and the interstitial silicon atom concentration $C_I$ is calculated by using the second numerical method, in which the temperature gradient of the two stages is set as a linear T profile. The research shows that the length d1 of the lower part 140A of the silicon crystal in the silicon melt and G2/G1 are important parameters that affect the position of the cross point. The normalized length x2 of the upper part 140B of the silicon crystal above the melt surface of the silicon melt is set to be constant (x2=5.5). Furthermore, since the distance from the growth interface G1 is far, the temperature of the melt surface decreases as the length d1 of the lower part 140A of the silicon single crystal increases.

Specifically, the solid-point curve in FIG. 5 corresponds to the value of the Y-axis on the left, which represents the distribution of a normalized distance between an cross point and the growth interface under different temperature gradient ratios in two stages, and the hollow-point curve in FIG. 5 corresponds to the value of the Y-axis on the right, which represents the temperature change distribution at the cross point under different temperature gradient ratios in two stages. For the linear T profile, the distance from the interface or the melt surface position to the cross point, Zc can be expressed using the normalized distance, X as following equation from Eq. (18):

$$Zc = (k_B T_m^2 X)/(G(E_I^f + E_V^f)/2 + X k_B T_m G)$$

For the Voronkov's profile, the following equation can be used, $$Zc = 2X/(1/L),$$

$$1/L = EG0/(k_B T_m^2),$$

$$E = (E_I^f + E_V^f)/2,$$

In FIG. 5, d1 and G1 are set as 5 cm and 3 K cm$^{-1}$, respectively, and the growth rate v is set as 0.000144 cm/s. The continuous growing step may also include a step of adjusting the growth rate of the silicon ingot single crystal, and the growth rate in the silicon single crystal growing step may be controlled in the range of 0.0002 cm/s to 0.002 cm/s.

Please refer to the solid-point curve in FIG. 5 and its corresponding value on Y-axis on the left. In this embodiment, the normalized value x of the critical distance Zc between the melt surface position of the silicon melt and the growth interface is close to 0.2 approximately. As can be seen from the solid-point curve in FIG. 5 and the value on the Y-axis on the left, as G2/G1 increases, the critical distance Zc decreases. In other words, as G2/G1 becomes smaller, the cross point is further away from the growth interface. When G2/G1 is greater 6, the normalized distance x of the critical distance Zc between the cross point and the growth interface is close to a constant value, approximately between 0.4 and 0.6, which is close to the position of the melt surface 130S of the silicon melt 130.

On the other hand, referring to the hollow-point curve in FIG. 5 and its corresponding value on the Y-axis on the right, the temperature of the silicon single crystal at the cross point is also shown as a function of G2/G1. As can be seen from the hollow-point curve in FIG. 5 and the value on the Y-axis on the right, the temperature of the cross point increases with the increase of G2/G1. In other words, the temperature of the cross point becomes smaller along with the change of G2/G1, and finally reaches a minimum temperature near the critical point, as indicated by a value between 1590K and 1600K shown on the right side of FIG. 5.

FIG. 6 is a schematic relationship diagram showing the vacancy concentration at the cross point that changes along with G2/G1 when G1 is 3 K cm$^{-1}$. In FIG. 6, the length d1 of the silicon single crystal under the melt surface along the axial direction is 5 cm. As mentioned above, at the cross point, the vacancy concentration $C_V$ of the silicon single crystal is equal to the interstitial silicon atom concentration $C_I$, and the vacancy concentration of the silicon single crystal at the cross point is called the vacancy equilibrium concentration $C_V^{eq}$. As shown in FIG. 6, the vacancy equilibrium concentration $C_V^{eq}$ decreases as G2/G1 decreases, and in FIG. 6, the lowest vacancy equilibrium concentration $C_V^{eq}$ at the cross point appears when G2/G1 is about 3 K cm$^{-1}$. Under the circumstances, the minimum vacancy concentration threshold $C_{V_{min}}$ is approximately between 1.0× 10$^{14}$ and 1.5×10$^{14}$ cm$^{-3}$.

FIG. 7 is a schematic relationship diagram showing the vacancy concentration at the cross point that changes along with G2/G1 when G1 is 6 K cm$^{-1}$. FIG. 7 has the same conditions as FIG. 6, the only difference is that G1 in FIG. 7 is 6 K cm$^{-1}$, while G1 in FIG. 6 is 3 K cm$^{-1}$. As shown in FIG. 7, the vacancy equilibrium concentration $C_V^{eq}$ is decreased to be close to the vacancy concentration threshold $C_{V_{min}}$ as G2/G1 is decreased. Furthermore, in FIG. 7, G2/G1 where the lowest vacancy equilibrium concentration $C_V^{eq}$ at the cross point appears may be as low as about 1 K cm$^{-1}$. Under the circumstances, the minimum vacancy concentration threshold $C_{V_{min}}$ is about 0.5×10$^{14}$.

It can be seen from the comparison between FIG. 6 and FIG. 7 that the minimum G2/G1 where the lowest vacancy concentration threshold $C_{V_{min}}$ at the cross point appears becomes smaller as G1 becomes larger. For example, in FIG. 6 where G1 is 3 K cm$^{-1}$, the minimum G2/G1 where the lowest vacancy concentration threshold $C_{V_{min}}$ at the cross point appears is about 3. On the other hand, in FIG. 7 where G1 is 6 K cm$^{-1}$, the minimum G2/G1 where the lowest vacancy concentration threshold $C_{V_{min}}$ at the cross point appears is reduced to about 1.

FIG. 8 is a schematic diagram showing the relationship between the normalized distance of the cross point and the under-surface length d1 of the silicon single crystal under different temperature gradient conditions in two stages. The solid-point curve in FIG. 8 shows that the critical distance Zc (the normalized distance Xs) at the cross point is reduced as the under-surface length d1 of the silicon single crystal 140 increases in the condition where the above-surface temperature gradient G2 is 10.5 K cm$^{-1}$. In other words, the longer the under-surface length d1 is, the closer the critical distance Zc (the normalized distance Xs) at the cross point is to the melt surface 130S.

On the other hand, in FIG. 8, the condition at the hollow-point curve is the same as the condition at the solid-point curve, but the hollow-point curve in FIG. 8 indicates that in the state where G2/G1 is 5.0 and the above-surface temperature gradient G2 is 15 K cm$^{-1}$, the critical distance Zc (the normalized distance Xs) at the cross point also decreases with the increase of the under-surface length d1 of the silicon single crystal. It can be seen from the tendency of the solid-point curve and the hollow-point curve in FIG. 8 that as the under-surface length d1 of the silicon single crystal increases, the critical distance Zc at the cross point is closer to the melt surface 130S of the silicon melt 130.

In addition, comparing the solid-point curve with the hollow-point curve in FIG. 8, it can be seen that as G2/G1 increases, the position of the cross point is closer to the melt surface 130S of the silicon melt 130. For example, when the under-surface length d1 of the silicon single crystal is 5 cm, the normalized value Xs1 of the critical distance Xc with G2/G1 as 5.0 is less than the normalized value Xs2 of the critical distance Zc with G2/G1 as 3.5. That is, the larger G2/G1 is, the smaller the normalized value Xs is, and the closer the critical distance is to the melt surface 130S.

Based on the foregoing, the vacancy concentration of the silicon single crystal at the cross point is called the vacancy equilibrium concentration $C_V^{eq}$. FIG. 9 is a schematic diagram showing the relationship between the vacancy equilibrium concentration $C_V^{eq}$ at the cross point and the under-surface length d1 of the silicon single crystal when G1 is 3 K cm$^{-1}$ and G2/G1 and above-surface temperature gradient G2 are different. Please refer to the solid-point curve in FIG. 9, the solid-point curve indicates that in the state where G2/G1 is 5.0 and G2 is 15 Kcm$^{-1}$, as the under-surface length d1 of the silicon single crystal increases, the vacancy equilibrium concentration $C_V^{eq}$ at the cross point gradually decreases. In contrast, please refer to the hollow-point curve in FIG. 9, the hollow-point curve indicates that in the state where G2/G1 is 3.5 and G2 is 10.5 K cm$^{-1}$, the vacancy equilibrium concentration $C_V^{eq}$ at the cross point is slightly dropped within the range where the under-surface length d1=25 cm. It can be seen from FIG. 9 that the larger G2/G1 is, the more the slope of the vacancy equilibrium concentration $C_V^{eq}$ decreases as the under-surface length d1 of the silicon single crystal increases. The smaller G2/G1 is, the change of the vacancy equilibrium concentration $C_V^{eq}$ tends to be relatively gradual.

In addition, comparing the solid-point curve with the hollow-point curve of FIG. 9, it can be seen that when G2/G1 becomes smaller, the vacancy equilibrium concentration $C_V^{eq}$ at the cross point becomes smaller.

FIG. 10 shows a schematic diagram of the relationship between the vacancy equilibrium concentration $C_V^{eq}$ at the cross point and the under-surface length d1 of the silicon single crystal under the condition that the under-surface temperature gradient G1 is 6 K cm$^{-1}$, the above-surface temperature gradient G2 is 12 K cm$^{-1}$, and G2/G1 is 2.0. As shown in FIG. 10, with the increase of the under-surface length d1 of the silicon single crystal, the vacancy equilibrium concentration $C_V^{eq}$ decreases significantly.

Comparing FIG. 9 with FIG. 10, it can be seen that if the under-surface temperature gradient G1 becomes larger, G2/G1 should be correspondingly reduced in order to obtain a smaller vacancy equilibrium concentration $C_V^{eq}$. In addition, the under-surface length d1 is closely related to the formation position of the low-temperature region in the silicon melt and the thermal field temperature gradient distribution. The inventor(s)' painstaking research found that in the growth step of the silicon ingot single crystal, the temperature gradient of the growing silicon single crystal needs to be spatially divided into two stages to control the under-surface temperature gradient G1 and the above-surface temperature gradient G2, so that G1 and G2 satisfy a range defined by formula (1): G2/G1<6. In addition, the temperature gradient control step satisfying the above-mentioned conditions is dynamically repeated over time, so that an ultra-high-quality and low-defect silicon single crystal may be grown versatilely and reproducibly.

FIG. 11 is a schematic diagram showing a two-dimensional-distribution of the vacancy equilibrium concentration $C_V^{eq}$ at the cross point where G1 is 6 K cm$^{-1}$ and growth rate v is 0.000144 cm$^{s-1}$, where X-axis represents different G2/G1 ratios, while Y-axis represents the under-surface length d1 of the silicon single crystal. The solid lines in FIG. 11 show the iso-concentration curves of the vacancy equilibrium concentration $C_V^{eq}$ for G2/G1 and d1. As shown in FIG. 11, when G2/G1 is smaller, the vacancy equilibrium concentration $C_V^{eq}$ has the lower value. The vacancy equilibrium concentration $C_V^{eq}$ has a tendency to become higher when G2/G1 becomes larger.

Moreover, it can be seen from FIG. 11 that a higher vacancy equilibrium concentration $C_V^{eq}$ appears in the region where G2/G1 is close to 6 and the under-surface length d1 is lower, and the higher vacancy equilibrium concentration $C_V^{eq}$ means that the vacancy concentration and the interstitial silicon atom concentration are less likely to achieve equilibrium, and it is more difficult to complete pair-annihilation. Therefore, after exploration, the inventor(s) proposes that when the under-surface temperature gradient G1 and the above-surface temperature gradient G2 of the silicon single crystal satisfy the range defined by formula (1): G2/G1<6, it is possible to versatilely and reproducibly grow ultra-high-quality and low-defect silicon single crystal.

On the other hand, the lower vacancy equilibrium concentration $C_V^{eq}$ appears in the region where G2/G1 is close to 1 and the under-surface length d1 is longer, and the longer under-surface length d1 means that it might be necessary to more precisely control the low-temperature region to a deeper position below the melt surface during the manufacturing process, so that silicon single crystals maintain concentration equilibrium at a far distance from the melt surface for crystal growth to be performed. Therefore, it is preferable that the under-surface temperature gradient G1 and the above-surface temperature gradient G2 of the silicon single crystal further satisfy the range defined by formula (2): 1<G2/G1<6. By satisfying the above range, not only that it is possible to grow ultra-high-quality and low-defect silicon single crystals, the process margin may be further improved in terms of process control. Preferably, the under-surface temperature gradient G1 and the above-surface temperature gradient G2 of the silicon single crystal further satisfy the range defined by formula (3): 2<G2/G1<3. When the range defined by the above formula (3) is satisfied, a better concentration control result may be obtained, and the versatility is further improved to grow a silicon single crystal with ultra-high quality and low defects.

Through the present disclosure, the growth of an ultra-high-quality silicon ingot single crystal having a defect-free region will be described specifically in the following example as an example.

Example 1

In Example 1, the size of the crucible was 250 mm in diameter, and the weight of the silicon raw material was 10 kg. In a manufacturing device of silicon ingot single crystal, the silicon raw material was filled into a quartz crucible, and placed at a predetermined position. In this case, under the bottom of the crucible, a plate (250 mm in diameter) with the following structure is placed in advance; said plate is formed by a circular heat shield made of graphite with a diameter of 200 mm assembled with an annular plate which is made of a material with good thermal conductivity and arranged around the circular heat shield.

Then, the temperature was raised to about 1,420° C. in an argon (Ar) atmosphere to completely melt the silicon raw material. Next, the temperature of the crucible was lowered to 1.5k lower than the melting point temperature of Si, and the Si seed crystal was made to reach the melt surface of the silicon melt to be brought into contact with the melt surface of the silicon melt to start crystal growth. Thereafter, by using a necking technique, the crystals are subjected to no dislocation for grown crystals from the seed crystals.

In addition, the temperature of the entire silicon melt was lowered to increase the low-temperature region, and before the pulling for growth was started, the crystals were diffused and grown along the melt surface of the silicon melt and toward the interior of the silicon melt. While the following two-stage temperature control is performed, the silicon single crystal was grown continuously, and the upper part of the silicon single crystal and the lower part of the silicon single crystal were grown above the melt surface of the silicon melt.

Under the circumstances, the under-surface temperature gradient of the lower part of the silicon single crystal below the melt surface 130S of the silicon melt was calculated the temperature by the above simulation model to be G1, and the above-surface temperature gradient of the upper part of the silicon single crystal exposed from the melt surface 130S of the silicon melt was calculated the temperature by the above simulation model to be G2. As shown in FIG. 12, the calculated position of the above-surface temperature gradient G2 is shown in FIG. 12, the above-surface temperature gradient G2 may be obtained by calculating the temperature of the upper part 140B of the silicon single crystal at the position P1 at a specific length (usually 1 cm) above the melt surface 130S, and calculating the temperature of the upper part 140B of the silicon single crystal at the position P2 at the melt surface 130S.

On the other hand, the measurement position of the under-surface temperature gradient G1 is shown in FIG. 12, the under-surface temperature gradient G1 may be obtained by measuring the temperature of the lower part 140A of the silicon single crystal at the position P3 at a specific length (usually 1 cm) above the growth interface G1 of the silicon melt 130, and measuring the temperature of the lower part 140A of the silicon single crystal at the position P4 at the growth interface G1. In Example 1, since the distance between the measured positions P1 and P2 is 0.7 cm, further conversion is made for G2 in the following table. The detailed temperature gradients G1 and G2 are summarized in the Table 2 below.

Thereafter, a silicon ingot single crystal was grown in the silicon melt using a low-temperature region while reducing the temperature of the silicon melt at a cooling rate of 0.2 K/min. After the crystal was grown to a predetermined size, as with the growth, the silicon ingot single crystal that has grown and has no dislocation was pulled at a pulling speed of 0.000144 cm/s. In the meantime, the silicon ingot single crystal was grown continuously in the silicon melt.

During the growth process, observation was performed continuously to observe the edge of the silicon ingot single crystal through an observation window, so as to ensure that the silicon ingot single crystal does not contact the crucible wall. The under-surface temperature gradient G1 and the above-surface temperature gradient G2, as well as G2/G1 were continuously controlled, and the growth time was 210 minutes. When the silicon ingot single crystal reached a predetermined length, the pulling speed was gradually increased to separate the grown silicon ingot single crystal from the silicon melt, and the bottom of the silicon ingot single crystal was squeezed finely to terminate the growth. The grown ingot has a concave bottom facing the growth direction.

Example 2-3

In Example 2-3, except that G1, G2, and G2/G1 were changed, the same steps and conditions as in Example 1 were adopted for crystal growth.

Comparative Example 1

In Comparative Example 1, except that G1 and G2 were changed so that G2/G1 exceeded 6, crystal growth was carried out by adopting the same steps and conditions as in Example 1.
COP Defect Evaluation Method:

The measurement conditions for evaluating COP are as follows:

Polished wafer: complete particle counter inspection

The COP defect of advanced equipment is basically 0.

Therefore, the quality required for the silicon ingot single crystal currently adopted in semiconductors is met. Under the circumstances, the COP concentration could not be detected by the particle counter. Theoretically, the COP concentration of the 0.1 μm-sized micro-defects that accumulate lattice vacancy in the silicon ingot single crystal is on the order of $10^7/cm^3$, so it may be regarded that the silicon ingot single crystal thus formed has almost no defects.

The silicon ingot single crystal manufactured based on the above-mentioned manufacturing method of Example 1 has a weight of 2 kg, a length of 51 mm, and a maximum diameter of 177 mm. Moreover, according to the above-mentioned evaluation equipment and evaluation method, it may be ensured that the silicon ingot single crystal grown from the part about 70 mm from the top of the silicon ingot single crystal has no COP, that is, by adopting the existing test equipment and conditions, it may be ensured that the silicon ingot single crystal thus grown has no measurable point defects such as COP.

In addition, the weight, length, and maximum diameter of the silicon ingot single crystal measured in Example 2-3 are summarized in the following Table 2. According to the above-mentioned evaluation equipment and evaluation method, it may be ensured that the silicon ingot single crystal grown from the part about 70 mm from the top of the silicon ingot single crystal has no COP, that is, by adopting the existing test equipment and conditions, it may be ensured that the silicon ingot single crystal thus grown has no measurable COP.

TABLE 2

| Temperature | Measurement position | Example 1 | Example 2 | Example 3 |
|---|---|---|---|---|
| Upper part of silicon single crystal | P1 | 1585.05 | 1586.81 | 1595.89 |
| | P2 | 1603.84 | 1610.32 | 1618.31 |
| | ΔT(K) | 18.79 (The measured distance between P1 and P2 is 0.7 cm) | 23.51 | 22.42 |
| | G2(K/cm) | 26.84 | 23.51 | 22.42 |
| Lower part of silicon single crystal | P3 | 1674.21 | 1677.37 | 1675.21 |
| | P4 | 1685 | | |
| | ΔT(K) | 10.79 | 7.63 | 9.79 |
| | G1(K/cm) | 10.79 | 7.63 | 9.79 |
| | G2/G1 | 2.49 | 3.08 | 2.29 |
| Silicon ingot single crystal | Weight (kg) | 2 | 3 | 5 |
| | Length (mm) | 51 | 68 | 81 |
| | Maximum diameter (mm) | 177 | 177 | 187 |
| Evaluation of COP | | Confirmed that there is no COP | | |

In this way, by using the theoretical basis established in this specification, and by controlling the above-surface and under-surface temperature gradients of the silicon single crystal in two stages to satisfy a specific relationship, the silicon ingot single crystal thus grown may be obtained with no COP. Therefore, the present disclosure is a method for producing a silicon ingot single crystal which may contribute to improving crystal quality.

In particular, the present disclosure completely constructs a manufacturing method of silicon ingot single crystal by means of an NOC method, which controls the above-surface temperature gradient and lower-surface temperature gradient of the silicon melt in two stages, so that the practitioners can more accurately and easily manufacture the silicon ingot single crystal with the established point defect concentration relationship by controlling the temperature gradients of the silicon melt in two stages.

What is claimed is:

1. A manufacturing method of a silicon ingot single crystal, which manufactures the silicon ingot single crystal by means of a non-contact crucible (NOC) method, comprising:
    a silicon ingot single crystal growing step, wherein the silicon ingot single crystal is grown in a silicon melt in a crucible, and the silicon ingot single crystal growing step comprises:
        providing a low-temperature region in the silicon melt; and
        providing a silicon seed to contact a melt surface to start crystal growth, wherein a silicon single crystal grows along the melt surface and toward the inside of the silicon melt;
    a controlling step for controlling temperature gradients of the silicon single crystal, wherein an under-surface temperature gradient of the silicon single crystal under the melt surface is set as G1, an above-surface temperature gradient of the silicon single crystal above the melt surface is set as G2, and the under-surface temperature gradient G1 and the above-surface temperature gradient G2 of the silicon single crystal satisfy a formula (1):

$$G2/G1 < 6 \qquad (1); \text{ and}$$

a continuous growing step, wherein the step of controlling the temperature gradients of the silicon single crystal is repeated to obtain the silicon ingot single crystal.

2. The manufacturing method of the silicon ingot single crystal according to claim 1, wherein an under-surface length of the silicon single crystal under the melt surface along an axial direction is d1, a temperature of the silicon single crystal at the melt surface is $T_s$, a temperature of the silicon single crystal at a growth interface is $T_m$, the under-surface temperature gradient G1 is $(T_m-T_s)/d1$, and the above-surface temperature gradient G2 is greater than the under-surface temperature gradient G1.

3. The manufacturing method of the silicon ingot single crystal according to claim 1, wherein there is a growth interface between the silicon single crystal under the melt surface and the low-temperature region, during the growth of the silicon single crystal, the silicon single crystal has a vacancy concentration distribution where a vacancy concentration is reduced along with an increase of a distance from the growth interface, and an interstitial silicon atom concentration distribution where an interstitial silicon atom concentration is reduced along with the increase of the distance from the growth interface, wherein the under-surface temperature gradient G1 and the above-surface temperature gradient G2 are controlled such that in the vacancy concentration distribution and the interstitial silicon atom concentration, along with the increase of the distance from the growth interface, the vacancy concentration and the interstitial silicon atom concentration in the silicon single crystal are reduced respectively and become close to each other accordingly.

4. The manufacturing method of the silicon ingot single crystal according claim 3, wherein there is an cross point between the vacancy concentration distribution and the interstitial silicon atom concentration distribution, the vacancy concentration of the silicon single crystal at the cross point is substantially equal to the interstitial silicon atom concentration, and a distance between the growth interface and the cross point is a critical distance Zc.

5. The manufacturing method of the silicon ingot single crystal according to claim 4, wherein as G2/G1 increases, the critical distance Zc decreases.

6. The manufacturing method of the silicon ingot single crystal according to claim 4, wherein a temperature of the silicon single crystal at the cross point increases as G2/G1 increases.

7. The manufacturing method of the silicon ingot single crystal according to claim 4, wherein the vacancy concentration of the silicon single crystal at the cross point is a vacancy equilibrium concentration $Cv^{eq}$, and the vacancy equilibrium concentration $Cv^{eq}$ decreases to be close to a vacancy concentration threshold $Cv_{min}$ as G2/G1 decreases.

8. The manufacturing method of the silicon ingot single crystal according to claim 7, wherein when the under-surface temperature gradient G1 is higher, the minimum G2/G1 corresponding to the vacancy concentration threshold $Cv_{min}$ has a lower value.

9. The manufacturing method of the silicon ingot single crystal according to claim 4, wherein an under-surface length of the silicon single crystal under the melt surface of the silicon melt along an axial direction is d1, and under a condition where the G2/G1 is the same, the critical distance Zc decreases along with an increase of the under-surface length d1.

10. The manufacturing method of the silicon ingot single crystal according to claim 9, wherein in a condition where the under-surface length d1 is the same, when the G2/G1 becomes larger, the critical distance Zc becomes smaller.

11. The manufacturing method of the silicon ingot single crystal according to claim 4, wherein the vacancy concentration of the silicon single crystal at the cross point is a vacancy equilibrium concentration $Cv^{eq}$, and an under-surface length of the silicon single crystal under the melt surface of the silicon melt along an axial direction is d1, in a relationship graph showing a relationship between the vacancy equilibrium concentration $Cv^{eq}$ and the under-surface length d1, when the G2/G1 becomes larger, a slope of the vacancy equilibrium concentration $Cv^{eq}$ decreases more along with an increase of the under-surface length d1.

12. The manufacturing method of the silicon ingot single crystal according to claim 1, wherein the under-surface temperature gradient G1 and the above-surface temperature gradient G2 of the silicon single crystal further satisfy a formula (2):

$$1 < G2/G1 < 6 \qquad (2).$$

13. The manufacturing method of the silicon ingot single crystal according to claim 1, wherein the under-surface temperature gradient G1 and the above-surface temperature gradient G2 of the silicon single crystal further satisfy a formula (3):

$$2 < G2/G1 < 3 \qquad (3).$$

14. The manufacturing method of the silicon ingot single crystal according to claim 1, wherein the continuous growing step further comprises a step of adjusting a growth rate of the silicon ingot single crystal.

15. The manufacturing method of the silicon ingot single crystal according to claim 14, wherein the growth rate in the silicon single crystal growing step is 0.0002 cm/s to 0.002 cm/s.

* * * * *